United States Patent
Iwamura

(10) Patent No.: US 7,103,827 B2
(45) Date of Patent: Sep. 5, 2006

(54) METHOD AND APPARATUS FOR DETECTING START POSITION OF CODE SEQUENCE, AND DECODING METHOD AND APPARATUS USING THE SAME

(75) Inventor: Keiichi Iwamura, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 247 days.

(21) Appl. No.: 10/233,504

(22) Filed: Sep. 4, 2002

(65) Prior Publication Data

US 2003/0051200 A1    Mar. 13, 2003

(30) Foreign Application Priority Data

Sep. 4, 2001 (JP) ............................... 2001-267904

(51) Int. Cl.
*H03M 13/15* (2006.01)
*H03M 13/33* (2006.01)

(52) U.S. Cl. ................. 714/775; 714/781; 714/798

(58) Field of Classification Search ............... 714/775, 714/798, 781
See application file for complete search history.

(56) References Cited

U.S. PATENT DOCUMENTS

| | | | |
|---|---|---|---|
| 3,336,467 A * | 8/1967 | Frey, Jr. ..................... 714/775 |
| 4,468,770 A * | 8/1984 | Metcalf et al. ............. 714/775 |
| 5,131,012 A * | 7/1992 | Dravida ...................... 375/357 |
| 5,345,451 A * | 9/1994 | Uriu et al. ................... 714/775 |
| 5,367,544 A * | 11/1994 | Bruekheimer ............... 375/368 |
| 5,535,140 A | 7/1996 | Iwamura ...................... 364/550 |
| 5,604,752 A | 2/1997 | Iwamura ..................... 371/37.1 |
| 5,715,259 A * | 2/1998 | Lee et al. .................... 714/775 |
| 5,724,034 A * | 3/1998 | Nielander et al. ............ 341/94 |
| 5,742,620 A | 4/1998 | Iwamura ................... 371/37.11 |
| 5,764,876 A * | 6/1998 | Yanagisawa et al. .......... 714/6 |
| 5,771,249 A * | 6/1998 | Yanagisawa ................ 714/798 |
| 6,434,253 B1 | 8/2002 | Hayashi et al. ............. 382/100 |

OTHER PUBLICATIONS

Ely et al., "High-Speed Decoding Technique for Slip Detection in Data Transmission Systems using Modified Cyclic Block Codes", Electronics Letters, Feb. 3, 1983, vol. 19, No. 3, pp. 109-110.*

* cited by examiner

Primary Examiner—Stephen M. Baker
(74) Attorney, Agent, or Firm—Fitzpatrick, Cella, Harper & Scinto

(57) ABSTRACT

A code sequence start position detection method and apparatus, and a decoding method and apparatus, which can quickly detect the start position of a code sequence by a simple processing arrangement, and can decode the code sequence on the basis of the detected start position, are provided. In order to detect a start position of a cyclic code sequence with a code length n, the cyclic code sequence with the code length n is input in turn, and a multiplier g, register r, and adder+generate a syndrome for a coded word from the first start position $c_{i-1}$ ($i=1, 2, \ldots$) to the first end position $c_{i-1+n}$ in the register r. A multiplier w and adder+correct the generated syndrome using data based on a coded word which is stored in an n-bit buffer and starts from the second start position $c_{i+n}$, and a NOR detects the start position of the cyclic code sequence with the code length n on the basis of the modified syndrome.

37 Claims, 22 Drawing Sheets

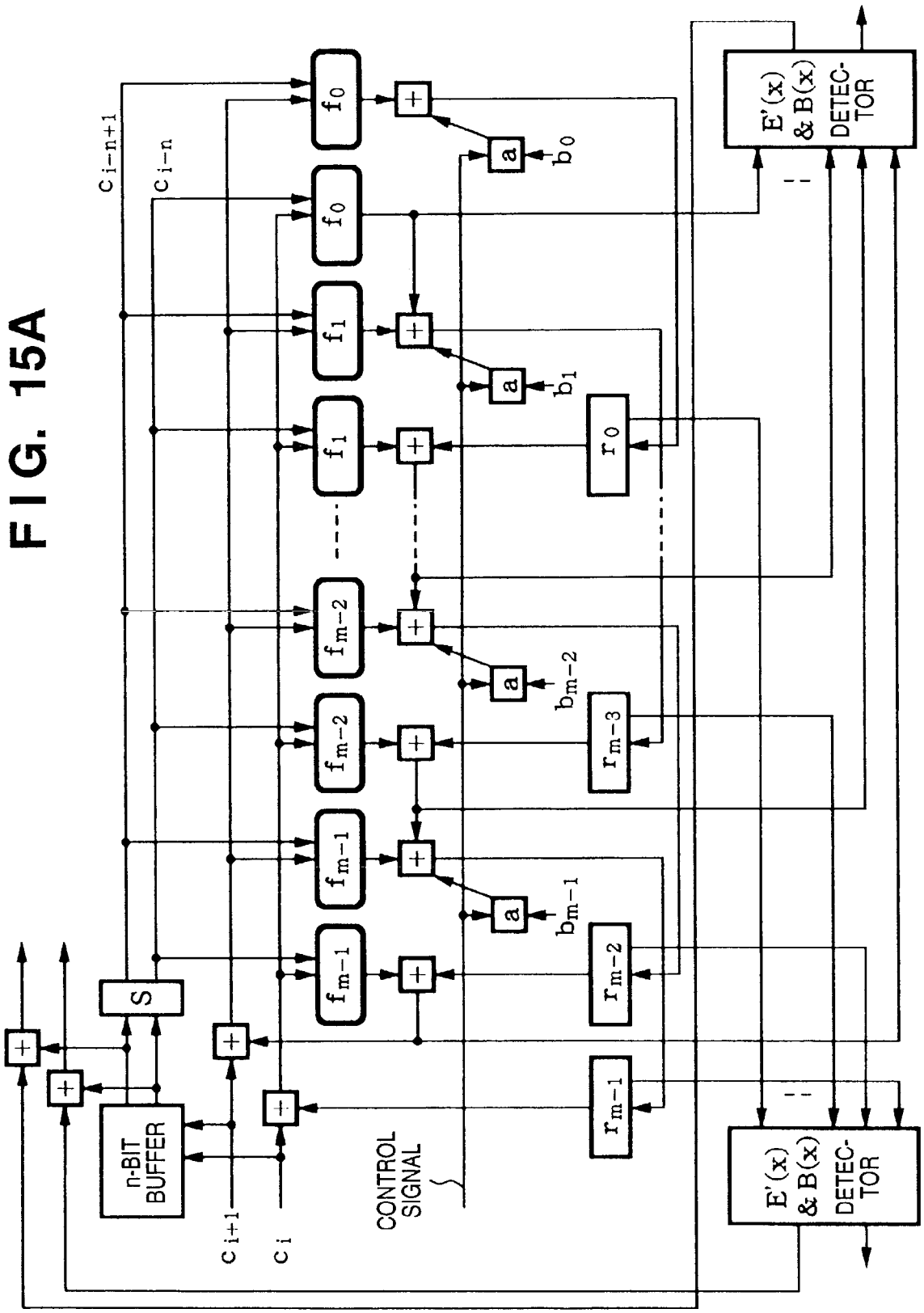
F I G. 15A

METHOD AND APPARATUS FOR DETECTING START POSITION OF CODE SEQUENCE, AND DECODING METHOD AND APPARATUS USING THE SAME

FIELD OF THE INVENTION

The present invention relates to a method and apparatus for detecting start position of code sequence, a communication method and apparatus using the same, and a decoding method and apparatus using the same and, more particularly, to a method and apparatus for detecting start position of code sequence, which establish cell or packet synchronization in ATM, B-ISDN, or the like using error correction codes upon decoding, a decoding method and apparatus using the same, and a communication method and apparatus using the same.

BACKGROUND OF THE INVENTION

Conventionally, cyclic codes such as a Hamming code, CRC, Fire code, BCH code, Reed-Solomon code, and the like are used in many communication systems and recording systems since they are easy to handle.

As shown in Hideki Imai, "Coding theory", the Institute of Electronics, Information and Communication Engineers, a circuit shown in FIG. 1 is prevalently used as an error detector for these cyclic codes. The circuit shown in FIG. 1 executes a process given by equation (3) that computes a remainder $S(x)$ (to be referred to as a syndrome hereinafter) as a result of dividing a received word $R(x)$ given by equation (1) as an input by a generator polynomial $G(x)$ given by equation (2). Note that $R(x)$ is designed so that the remainder of division by $G(x)$ becomes zero if there is no error.

$$R(x)=R_{N-1}\cdot x^{N-1}+R_{N-2}\cdot x^{N-2}+\ldots+R_1\cdot x+R_0 \qquad (1)$$

$$G(x)=x^m+g_{m-1}\cdot x^{m-1}+\ldots+g_1\cdot x+g_0 \qquad (2)$$

$$S(x)=R(x)\cdot x^m \bmod G(x) \qquad (3)$$

The circuit shown in FIG. 1 operates for every unit times (clocks). In the following description, each rectangle expressed by $r_i$ ($i=0, \ldots, m-1$) indicates a delay element (register) for one unit time. Also, each rectangle expressed by $g_i$ is a multiplier which multiplies an input by $g_i$, and outputs the product (if $g_i=0$, the connection itself is not required; if $g_i=1$, the multiplier is not required, and only the connection is required). Also, "+" indicates an EXOR (exclusive OR) arithmetic unit (which is adopted since arithmetic operations on the Galois field GFS(q) will be examined; in general, a subtractor is used). "NOR" indicates a NOR arithmetic unit.

When $R_j$ ($j=N-1, \ldots, 0$) has been input to this circuit every unit time in turn from higher degrees, if no error has occurred, $S(x)=0$ is obtained, i.e., all registers $r_i$ ($i=0, \ldots, m-1$) become "0". On the other hand, if an error has occurred, since $S(x) \neq 0$, and the NOR arithmetic unit output is not zero, it can be detected that an error has occurred in the received word. Upon forming an encoder which not only detects any error but corrects it, a circuit with an arrangement in FIG. 2 in which a NOR circuit 20 for detecting a specific pattern and an N-bit buffer 22 are added to FIG. 1 is used, and executes the following process.

A right NOR circuit 21 detects "0", and if $S(x)=0$ after the same process as in FIG. 1, the process terminates with no error. However, if $S(x) \neq 0$, shift registers are further kept shifted up to a maximum of N times with an input "0", and when a left NOR circuit 20 detects that the values of the shift registers have become a specific pattern based on a code, "1" is output to correct an error of an N-bit delayed received word. Since one shift process of the shift register corresponds to a computation for computing a remainder by multiplying $S(x)$ by x and dividing the product by $G(x)$, an arithmetic operation:

$$E(x)=S(x)\cdot x^j \bmod G(x) \; (j=0, \ldots, N-1) \qquad (4)$$

is made for each shift, i.e., for each j, and a received symbol $R_{N-j}$ when $E(x)$ has become a specific pattern undergoes error correction. For example, if a single error has occurred at a position N–i, we have:

$$S(x)=x^{-i+m} \bmod G(x)$$

and the (i–1)-th shift (j=i–1) yields:

$$E(x)=S(x)\cdot x^{i-1} \bmod G(x)=x^{m-1}$$

Hence, the left NOR circuit 20 detects:

$$r_{m-j}=0 (j=2, \ldots m)$$

$$r_{m-1}=1$$

Furthermore, when cyclic codes are used in practice, a coded word is normally shortened (see "Coding Theory"). Such code is equivalent to a cyclic code in which symbols of higher degrees of equation (1) are "0", and the correcting capability of the code remains intact. Such code is called a shortened cyclic code. For example, a generator polynomial $$G(x)=x^8+x^2+x+1$$

used in header error control of ATM (Asynchronous Transfer Mode) that has received a lot of attention as the next-generation communication scheme has a CRC code length $$N=2^7-1=127$$

bits. Normally such code is shortened to about 40 bits. In the following description, N represents the code length of a cyclic code specified by the generator polynomial $G(x)$, and n represents the code length obtained by shortening the code length N.

Upon decoding a shortened cyclic code by the circuit shown in FIG. 2, after the received word $R(x)$ is input, a maximum of N shifts and a buffer that stores the received word are required. The detector shown in FIG. 1 can be used in synchronization detection. In this case, a coded word is shifted in turn in increments of 1 bit to determine a new start position, and a coded word from the start position where no error is detected is adopted to synchronize each coded word.

Thereinafter, a term "synchronization detection" means to detect the start position (and/or end position) of code sequence.

The synchronization detection operation will be explained below using FIG. 3.

If one coded word is defined by the first start position to the first end position in FIG. 3, the coded word is expressed by:

$$c_1(x)=c_1\cdot x^{n-1}+c_2\cdot x^{n-2}+\ldots+c_{n-1}\cdot x+c_n$$

A syndrome $s_1(x)$ upon dividing this coded word by the generator polynomial given by equation (2) is expressed by:

$$s_1(x)=c_1(x)\cdot x^m \bmod G(x)$$

If $c_1(x)$ is a correct coded word, $s_1(x)=0$, and the coded word is synchronized. However, if $s_1(x) \neq 0$, since $c_1(x)$ is not a correct coded word, a syndrome $s_2(x)$ for a coded word $c_2(x)$ from the second start position to the second end position is computed by:

$$c_2(x) = c_2 \cdot x^{n-1} + c_3 \cdot x^{n-2} + \ldots + c_n \cdot x + c_{n+1}$$

$$s_2(x) = c_2(x) \cdot x^m \bmod G(x)$$

Furthermore, if $s_{i-1}(x) \neq 0 (i=3, \ldots )$, a syndrome $s_i(x)$ for $c_i(x)$ given by equation (6) is computed by equation (7), and such computation is repeated until $s_i(x)=0$, i.e., synchronization is attained.

$$c_i(x) = c_i \cdot x^{n-1} + c_{i+1} \cdot x^{n-2} + \ldots + c_{i+n-2} \cdot x + c_{i+n-1} \quad (6)$$

$$s_i(x) = c_i(x) \cdot x^m \bmod G(x) \quad (7)$$

Therefore, in order to implement this synchronization process, synchronization detection can be achieved using a plurality of circuits shown in FIG. 1 for each $s_i(x)$ $(i=1, \ldots )$.

On the other hand, since the decoder shown in FIG. 2 can also detect $s(x)=0$, if the same operations are made using a plurality of circuits shown in FIG. 2 in place of the detector in FIG. 1, the decoder shown in FIG. 2 can be used as a synchronization detection circuit.

However, since the aforementioned synchronization circuit uses a plurality of detectors or decoders, it requires a large circuit scale.

SUMMARY OF THE INVENTION

The present invention has been made in consideration of the above prior arts, and has as its object to provide a code sequence start position detection method and apparatus, and a decoding method and apparatus, which can quickly detect the start position of a code sequence by a simple processing arrangement, and can decode the code sequence on the basis of the detected start position.

In order to achieve the above object, a code sequence start position detection method and apparatus, a decoding method and apparatus using the same, and a communication method and apparatus using the same comprise the following arrangements.

That is, a start position detection method for receiving a cyclic code sequence with a code length n and detecting a start position of the cyclic code sequence, comprises the input step of inputting the cyclic code sequence with the code length n in turn, the syndrome generation step of generating a syndrome for a coded word from a first start position $c_{i-1}$ (i=1, 2, ...) to a first end position $c_{i-1+n}$ of the cyclic code sequence input in the input step, the modified syndrome generation step of modifying the syndrome generated in the syndrome generation step using data based on a coded word starting from a second start position $c_{1+n}$, and the detection step of detecting the start position of the cyclic code sequence with the code length n on the basis of the modified syndrome obtained in the modified syndrome generation step.

According to another invention, a cyclic code sequence with a code length n is decoded on the basis of a start position of the cyclic code sequence with the code length n detected by the aforementioned start position detection method.

According to still another invention, a decoding method for decoding a shortened cyclic code obtained by shortening a cyclic code with a code length N based on a generator polynomial G(x) of degree m to a code length n, comprises the input step of inputting the shortened cyclic code with the code length n in turn, the syndrome generation step of generating a syndrome for a coded word of the shortened cyclic code input in the input step, and the error correction step of detecting an error pattern E(x) on the basis of the syndrome generated in the syndrome generation step to correct an error of the coded word.

According to still another invention, a decoding method for receiving a shortened cyclic code sequence obtained by shortening a cyclic code with a code length N based on a generator polynomial G(x) of degree m to a code length n, detecting a start position of the shortened cyclic code sequence, and decoding the shortened cyclic code sequence, comprises the input step of inputting the shortened cyclic code sequence with the code length n in turn, the syndrome generation step of generating a syndrome for a coded word from a first start position $c_{i-1}$ (i=1, 2, ...) to a first end position $c_{i-1+n}$ of the shortened cyclic code sequence input in the input step, the modified syndrome generation step of modifying the syndrome generated in the syndrome generation step using data based on a coded word starting from a second start position $c_{i+n}$, the detection step of detecting the start position of the shortened cyclic code sequence with the code length n on the basis of the modified syndrome obtained in the modified syndrome generation step, and the decoding step of decoding the shortened cyclic code sequence with the code length n on the basis of the start position of the shortened cyclic code sequence with the code length n detected in the detection step.

According to still another invention, a start position detection method for receiving a cyclic code sequence with a code length n and detecting a start position of the cyclic code sequence, comprises the input step of parallelly inputting the cyclic code sequence with the code length n every d bits in turn, the syndrome generation step of generating a syndrome for a coded word from a first start position $c_{i-1}$ (i=1, 2, ...) to a first end position $c_{i-1+n}$ of the cyclic code sequence input in the input step, the modified syndrome generation step of modifying the syndrome generated in the syndrome generation step using data based on a coded word starting from a second start position $c_{i+n}$, and the detection step of detecting the start position of the cyclic code sequence with the code length n on the basis of the modified syndrome obtained in the modified syndrome generation step.

According to still another invention, a cyclic code sequence with a code length n is decoded on the basis of a start position of the cyclic code sequence with the code length n detected by the aforementioned start position detection method.

According to still another invention, a decoding method for decoding a shortened cyclic code obtained by shortening a cyclic code with a code length N based on a generator polynomial G(x) of degree m to a code length n, comprises the input step of parallelly inputting the shortened cyclic code with the code length n every d bits in turn, the syndrome generation step of generating a syndrome for a coded word of the shortened cyclic code input in the input step, and the error correction step of detecting an error pattern E(x) on the basis of the syndrome generated in the syndrome generation step to correct an error of the coded word.

According to still another invention, a decoding method for parallelly receiving every d bits of a shortened cyclic code sequence obtained by shortening a cyclic code with a code length N based on a generator polynomial G(x) of degree m to a code length n, detecting a start position of the shortened cyclic code sequence, and decoding the shortened cyclic code sequence, comprises the input step of parallelly inputting the shortened cyclic code sequence with the code length n every d bits in turn, the syndrome generation step of generating a syndrome for a coded word from a first start position $c_{i-1}$ (i=1, 2, . . . ) to a first end position $c_{i-1+n}$ of the shortened cyclic code sequence input in the input step, the modified syndrome generation step of modifying the syndrome generated in the syndrome generation step using data based on a coded word starting from a second start position $c_{i+n}$, the detection step of detecting the start position of the shortened cyclic code sequence with the code length n on the basis of the modified syndrome obtained in the modified syndrome generation step, and the decoding step of decoding the shortened cyclic code sequence with the code length n on the basis of the start position of the shortened cyclic code sequence with the code length n detected in the detection step.

According to still another invention, a start position detection method for receiving a cyclic code sequence including a coded word with a code length n in which a first predetermined pattern A(x) is added at a position $x^a$, and detecting a start position of the cyclic code sequence, comprises the input step of inputting the cyclic code sequence with the code length n in turn, the syndrome generation step of generating a syndrome for a coded word from a first start position $c_{i-1}$ (i=1, 2, . . . ) to a first end position $c_{i-1+n}$ of the cyclic code sequence input in the input step, the modified syndrome generation step of modifying the syndrome generated in the syndrome generation step using data based on a coded word starting from a second start position $c_{i+n}$, and the detection step of detecting the start position of the cyclic code sequence in which the modified syndrome obtained in the modified syndrome generation step is equal to a second predetermined pattern B(x).

According to still another invention, a cyclic code sequence with a code length n is decoded on the basis of a start position of the cyclic code sequence with the code length n detected by the aforementioned start position detection method.

According to still another invention, a decoding method for decoding a shortened cyclic code obtained by shortening, to a code length n, a cyclic code with a code length N in which a first predetermined pattern is added at a position $x^a$ and which is based on a generator polynomial G(x) of degree m, comprises the input step of inputting the shortened cyclic code with the code length n in turn, the syndrome generation step of generating a syndrome for a coded word of the shortened cyclic code input in the input step, and the error correction step of detecting a second predetermined error pattern E(x) on the basis of the syndrome generated in the syndrome generation step to correct an error of the coded word.

According to still another invention, a decoding method for receiving a shortened cyclic code obtained by shortening, to a code length n, a cyclic code with a code length N in which a first predetermined pattern is added at a position $x^a$ and which is based on a generator polynomial G(x) of degree m, detecting a start position of the shortened cyclic code sequence, and decoding the shortened cyclic code sequence, comprises the input step of inputting the shortened cyclic code sequence with the code length n in turn, the syndrome generation step of generating a syndrome for a coded word from a first start position $c_{i-1}$ (i=1, 2, . . . ) to a first end position $c_{i-1+n}$ of the shortened cyclic code sequence input in the input step, the modified syndrome generation step of modifying the syndrome generated in the syndrome generation step using data based on a coded word starting from a second start position $c_{i+n}$, the detection step of detecting the start position of the shortened cyclic code sequence with the code length n on the basis of the modified syndrome obtained in the modified syndrome generation step, and the decoding step of decoding the shortened cyclic code sequence with the code length n on the basis of the start position of the shortened cyclic code sequence with the code length n detected in the detection step.

According to still another invention, a cyclic code sequence with a code length n is decoded on the basis of a start position of the cyclic code sequence with the code length n detected by the aforementioned start position detection method.

According to still another invention, a start position detection apparatus for receiving a cyclic code sequence with a code length n and detecting a start position of the cyclic code sequence, comprises input means for inputting the cyclic code sequence with the code length n in turn, syndrome generation means for generating a syndrome for a coded word from a first start position $c_{i-1}$ (i=1, 2, . . . ) to a first end position $c_{i-1+n}$ of the cyclic code sequence input by the input means, modified syndrome generation means for modifying the syndrome generated by the syndrome generation means using data based on a coded word starting from a second start position $c_{i+n}$, and detection means for detecting the start position of the cyclic code sequence with the code length n on the basis of the modified syndrome obtained by the modified syndrome generation means.

According to still another invention, an apparatus comprises decoding means for decoding a cyclic code sequence with a code length n on the basis of a start position of the cyclic code sequence with the code length n detected by aforementioned start position detection apparatus.

According to still another invention, a decoding apparatus for decoding a shortened cyclic code obtained by shortening a cyclic code with a code length N based on a generator polynomial G(x) of degree m to a code length n, comprises input means for inputting the shortened cyclic code with the code length n in turn, syndrome generation means for generating a syndrome for a coded word of the shortened cyclic code input by the input means, and error correction means for detecting an error pattern E(x) on the basis of the syndrome generated by the syndrome generation means to correct an error of the coded word.

According to still another invention, a decoding apparatus for receiving a shortened cyclic code sequence obtained by shortening a cyclic code with a code length N based on a generator polynomial G(x) of degree m to a code length n, detecting a start position of the shortened cyclic code sequence, and decoding the shortened cyclic code sequence, comprises input means for inputting the shortened cyclic code sequence with the code length n in turn, syndrome generation means for generating a syndrome for a coded word from a first start position $c_{i-1}$ (i=1, 2, . . . ) to a first end position $c_{i-1+n}$ of the shortened cyclic code sequence input by the input means, modified syndrome generation means for modifying the syndrome generated by the syndrome generation means using data based on a coded word starting from a second start position $c_{i+n}$, detection means for detecting the start position of the shortened cyclic code sequence with the code length n on the basis of the modified syndrome obtained by the modified syndrome generation means, and decoding means for decoding the shortened cyclic code sequence with the code length n on the basis of the start position of the shortened cyclic code sequence with the code length n detected by the detection means.

According to still another invention, a start position detection apparatus for receiving a cyclic code sequence with a code length n and detecting a start position of the cyclic code sequence, comprises input means for parallelly inputting the cyclic code sequence with the code length n every d bits in turn, syndrome generation means for generating a syndrome for a coded word from a first start position $c_{i-1}$ (i=1, 2, . . . ) to a first end position $c_{i-1+n}$ of the cyclic code sequence input by the input means, modified syndrome generation means for modifying the syndrome generated by the syndrome generation means using data based on a coded word starting from a second start position $c_{i+n}$, and detection means for detecting the start position of the cyclic code sequence with the code length n on the basis of the modified syndrome obtained by the modified syndrome generation means.

According to still another invention, an apparatus comprises decoding means for decoding a cyclic code sequence with a code length n on the basis of a start position of the cyclic code sequence with the code length n detected by aforementioned start position detection apparatus.

According to still another invention, a decoding apparatus for decoding a shortened cyclic code obtained by shortening a cyclic code with a code length N based on a generator polynomial G(x) of degree m to a code length n, comprises input means for parallelly inputting the shortened cyclic code with the code length n every d bits in turn, syndrome generation means for generating a syndrome for a coded word of the shortened cyclic code input by the input means, and error correction means for detecting an error pattern E(x) on the basis of the syndrome generated by the syndrome generation means to correct an error of the coded word.

According to still another invention, a decoding apparatus for parallelly receiving every d bits of a shortened cyclic code sequence obtained by shortening a cyclic code with a code length N based on a generator polynomial G(x) of degree m to a code length n, detecting a start position of the shortened cyclic code sequence, and decoding the shortened cyclic code sequence, comprises input means for parallelly inputting the shortened cyclic code sequence with the code length n every d bits in turn, syndrome generation means for generating a syndrome for a coded word from a first start position $c_{i-1}$ (i=1, 2, . . . ) to a first end position $c_{i-1+n}$ of the shortened cyclic code sequence input by the input means, modified syndrome generation means for modifying the syndrome generated by the syndrome generation means using data based on a coded word starting from a second start position $c_{i+n}$, detection means for detecting the start position of the shortened cyclic code sequence with the code length n on the basis of the modified syndrome obtained by the modified syndrome generation means, and decoding means for decoding the shortened cyclic code sequence with the code length n on the basis of the start position of the shortened cyclic code sequence with the code length n detected by the detection means.

According to still another invention, a start position detection apparatus for receiving a cyclic code sequence including a coded word with a code length n in which a first predetermined pattern A(x) is added at a position $x^a$, and detecting a start position of the cyclic code sequence, comprises input means for inputting the cyclic code sequence with the code length n in turn, syndrome generation means for generating a syndrome for a coded word from a first start position $c_{i-1}$ (i=1, 2, . . . ) to a first end position $c_{i-1+n}$ of the cyclic code sequence input by the input means, modified syndrome generation means for modifying the syndrome generated by the syndrome generation means using data based on a coded word starting from a second start position $c_{i+n}$, and detection means for detecting the start position of the cyclic code sequence in which the modified syndrome obtained by the modified syndrome generation means is equal to a second predetermined pattern B(x).

According to still another invention, an apparatus comprises decoding means for decoding a cyclic code sequence with a code length n on the basis of a start position of the cyclic code sequence with the code length n detected by aforementioned start position detection apparatus.

According to still another invention, a decoding apparatus for decoding a shortened cyclic code obtained by shortening, to a code length n, a cyclic code with a code length N in which a first predetermined pattern is added at a position $x^a$ and which is based on a generator polynomial G(x) of degree m, comprises input means for inputting the shortened cyclic code with the code length n in turn, syndrome generation means for generating a syndrome for a coded word of the shortened cyclic code input by the input means, and error correction means for detecting a second predetermined error pattern E(x) on the basis of the syndrome generated by the syndrome generation means to correct an error of the coded word.

According to still another invention, a decoding apparatus for receiving a shortened cyclic code obtained by shortening, to a code length n, a cyclic code with a code length N in which a first predetermined pattern is added at a position $x^a$ and which is based on a generator polynomial G(x) of degree m, detecting a start position of the shortened cyclic code sequence, and decoding the shortened cyclic code sequence, comprises input means for inputting the shortened cyclic code sequence with the code length n in turn, syndrome generation means for generating a syndrome for a coded word from a first start position $c_{i-1}$ (i=1, 2, . . . ) to a first end position $c_{i-1+n}$ of the shortened cyclic code sequence input by the input means, modified syndrome generation means for modifying the syndrome generated by the syndrome generation means using data based on a coded word starting from a second start position $c_{i+n}$, detection means for detecting the start position of the shortened cyclic code sequence with the code length n on the basis of the modified syndrome obtained by the modified syndrome generation means, and decoding means for decoding the shortened cyclic code sequence with the code length n on the basis of the start position of the shortened cyclic code sequence with the code length n detected by the detection means.

According to still another invention, an apparatus comprises decoding means for decoding a cyclic code sequence with a code length n on the basis of a start position of the cyclic code sequence with the code length n detected by aforementioned start position detection apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 15A is a block diagram showing a parallel shortened code decoder according to the ninth embodiment of the present invention;

DESCRIPTION OF THE PREFERRED EMBODIMENTS

First Embodiment

Figure 1:
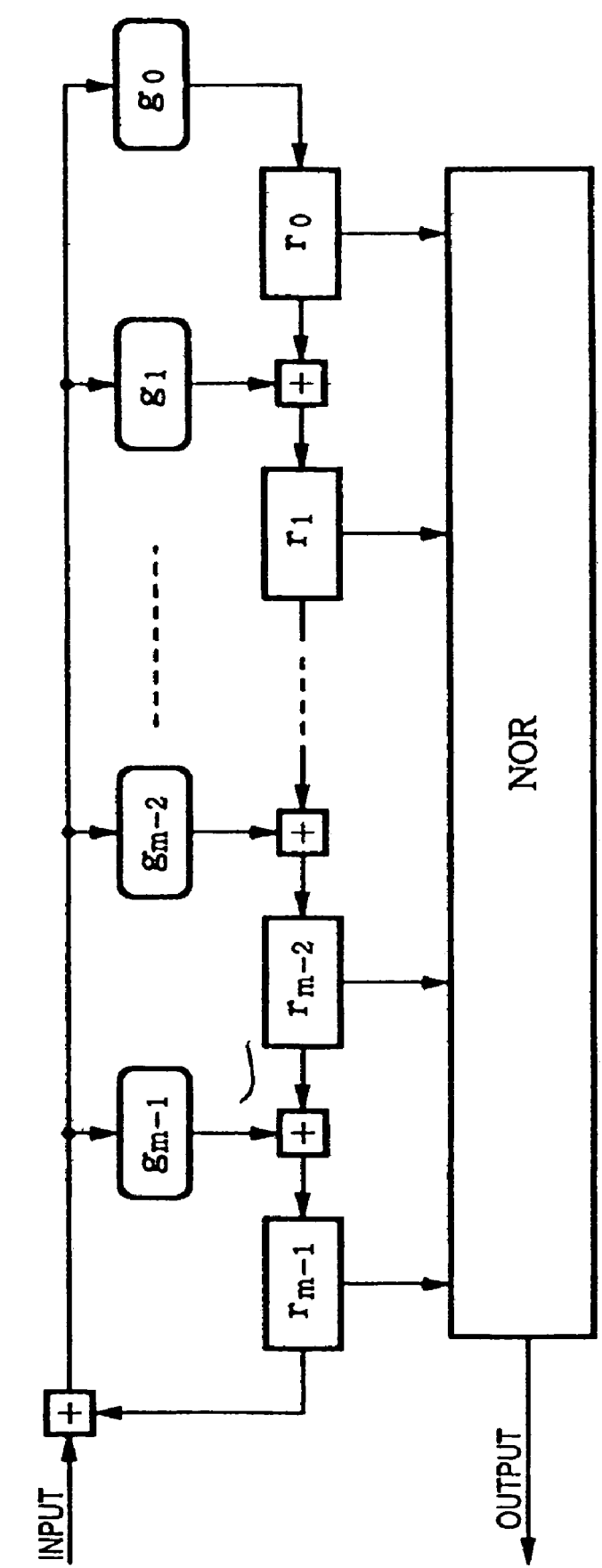
FIG. 1 is a block diagram showing a conventional error detector.

This embodiment will describe a circuit arrangement that can attain synchronization detection without using a plurality of detectors shown in FIG. 1.

From equations (6) and (7), syndromes $s_{i-1}(x)$ and $s_i(x)$ have a relationship given by:

$$s_i(x) = c_i(x) \cdot x^m \mathrm{mod} G(x) \qquad (8)$$
$$= (c_{i-1}(x) \cdot x + c_{i+n-1} - c_{i-1} \cdot x^n) \cdot x^m \mathrm{mod} G(x)$$
$$= (s_{i-1}(x) \cdot x + c_{i+n-1} \cdot x^m) \mathrm{mod} G(x) - c_{i-1} \cdot w(x)$$

In equation (8), $(s_{i-1}(x) \cdot x + c_{i+n-1} \cdot x^m)$ mod $G(x)$ is obtained by inputting $c_{i+n-1}$ and shifting shift registers for another clock when the detector shown in FIG. 1 obtains the syndrome $s_{i-1}$ (x). Since $c_{i+n-1}$ is the next bit of $c_{i+n-2}$, $$(s_{i-1}(x) \cdot x + c_{i+n-1} \cdot x^m) \bmod G(x)$$

can be obtained by repeating the operation of the detector. Also, w(x) is a polynomial defined by:

$$w(x) = x^{n+m} \mathrm{mod} G(x) = \sum_{j=0}^{m-1} w_j \cdot x^j$$

and can be obtained in advance as long as n and G(x) (m is the degree of G(x)) are known.

Hence, only when $c_{i-1}$ is "1", $s_i(x)$ can be obtained by subtracting w(x) from $$(s_{i-1}(x) \cdot x + c_{l+n-1} \cdot x^m) \bmod G(x)$$

mentioned above. Since $c_{i-1}$ is a bit n bits before $c_{i+n-1}$, a bit sequence shown in FIG. 3 must be delayed n bits by, e.g., a buffer.

Figure 3:
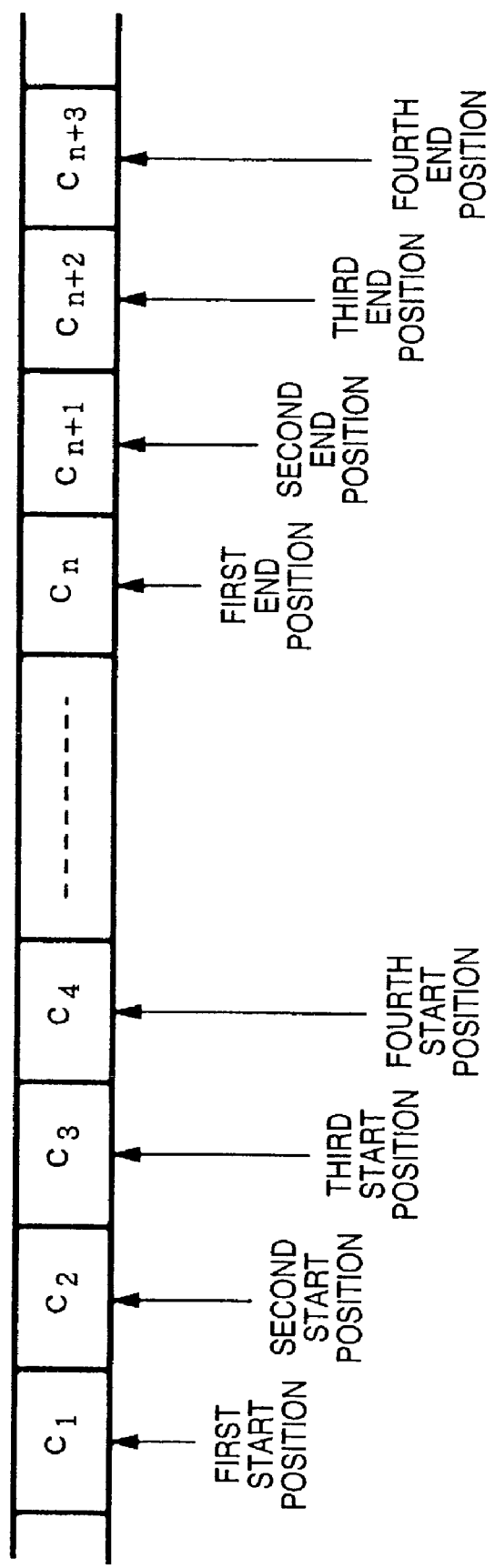
FIG. 3 is a view for explaining the concept of synchronization detection.
Figure 4:
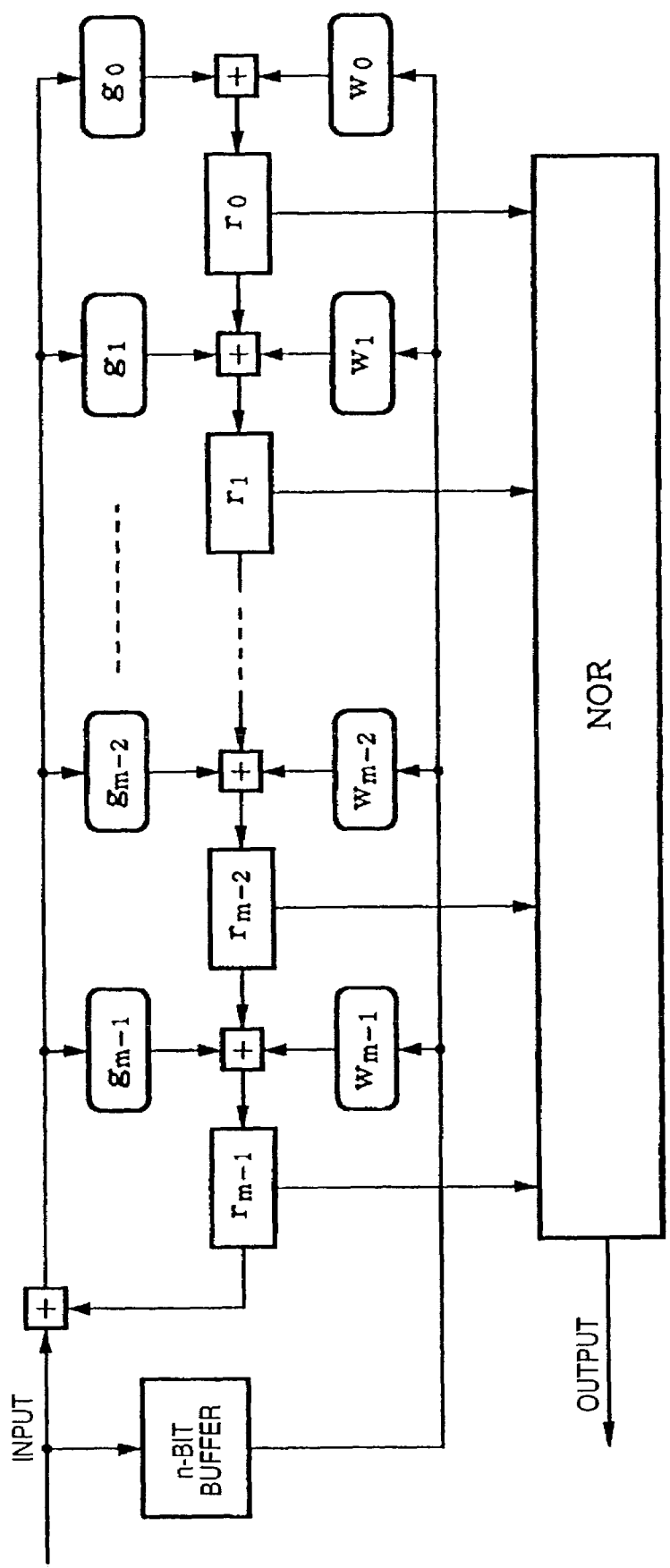
FIG. 4 is a block diagram showing a synchronization detection circuit according to the first embodiment of the present invention.

Therefore, a synchronization circuit using a detector according to this embodiment has an arrangement as shown in FIG. 4. The operation of this circuit is as follows. Assume that the bit sequence shown in FIG. 3 is input in turn from bit $c_1$ at the first start position. Since a circuit formed by $g_i$ and $r_i$ in FIG. 4 is the same as the detector shown in FIG. 1, a syndrome $s_1(x)$ is generated in registers $r_i$ (i=0, ..., m−1) after bit $c_n$ at the first end position is input. The bit sequence input to the detector is also input to an n-bit buffer and is delayed n bits, and this buffer output is "0" until the first end position is reached.

This $s_1(x)$ is inspected by a NOR circuit, and if $s_1(x)=0$, "1" is output as a synchronization detection signal. On the other hand, if $s_1(x) \neq 0$, bit $c_{n+1}$ at the second end position is continuously input to repeat the detection operation. At this time, since the n-bit buffer outputs delayed $c_1$, if $c_1=1$, $w_i$ (i=0, ..., m−1), i.e., w(x), is subtracted from each register (this operation is implemented by EXOR since binary arithmetic operations are made). In this manner, $s_2(x)$ is obtained. The NOR circuit makes "0" inspection of this $s_2(x)$, and if $s_2(x)=0$, a synchronization detection signal is output; if $s_2(x) \neq 0$, input is continuously made to have $c_{n+i}(i=2, ...)$ so as to repeat the aforementioned operation until $s_i(x)=0$. If $s_i(x)=0$, a synchronization detection signal is output.

Second Embodiment

The second embodiment will explain a case wherein N=n, i.e., a code is not shortened. In this embodiment, FIG. 5 shows a circuit arrangement that can attain synchronization detection without using a plurality of decoders in FIG. 2.

Figure 5:
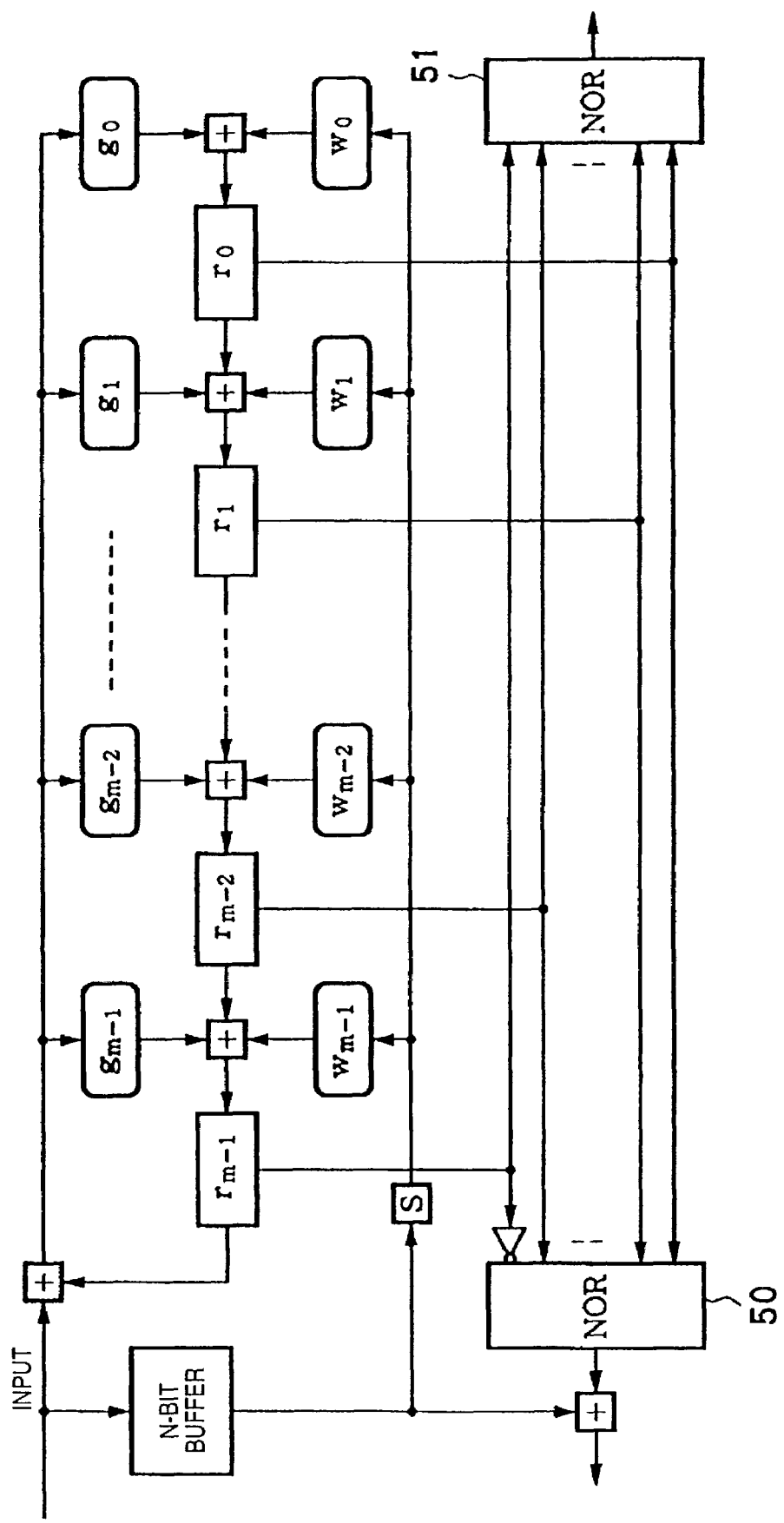
FIG. 5 is a block diagram showing a synchronization detector/decoder according to the second embodiment of the present invention.
Figure 8A:
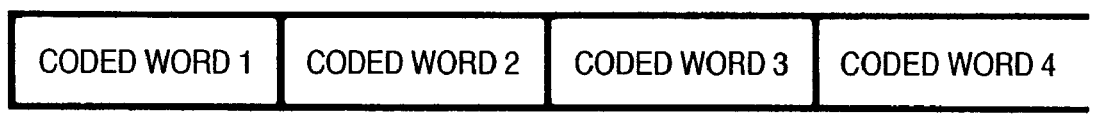
FIG. 8A is a view for explaining synchronization detection and a decoding process according to each embodiment of the present invention.
Figure 8B:
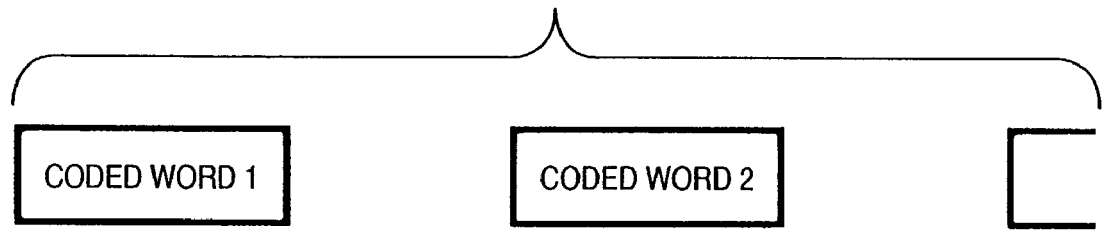
FIG. 8B is a view for explaining synchronization detection and a decoding process according to each embodiment of the present invention.

When coded words are continuously input, as shown in FIG. 8A, or when they are successively input at given intervals, as shown in FIG. 8B, the circuit shown in FIG. 5 detects synchronization based on early coded words. After synchronization is detected, i.e., after the delimiter of coded words can be detected, the circuit can execute error correction as an original function of the decoder. For example, when data input is started in the middle of coded word 1 in FIG. 8A, synchronization cannot be detected initially, i.e., the delimiter of coded words cannot be detected. Hence, by executing the detection operation while shifting bits, as described above, $$s(x)=0$$

is detected at the end of coded word 2 (assumed to be free from any error), and the delimiter (synchronization) is detected. In coded word 3 and subsequent coded words after synchronization is established, the decoder makes a decoding operation intended. However, synchronization may be established after respective synchronization detection of several coded words in place of the first synchronization detection.

In case of FIG. 8B, after synchronization is detected at the end of coded word 2, a process of coded word B can be started in consideration of the interval between coded words.

The operation of the circuit shown in FIG. 5 will be described below.

In the synchronization detection operation, a switch S is closed, and a NOR circuit (51) for making NOR logical operations executes "0" detection, the detection operation described in the first embodiment can be implemented by the circuit shown in FIG. 5.

When "0" is detected, and synchronization is established, the switch S is opened to remove the influence of w(x) of equation (9), and error correction is attained by detecting a specific pattern (detection of $E(x)=x^{m-1}$, since N=n) according to a code. In this way, the circuit in FIG. 5 can execute the same decoding operation as that of the decoder in FIG. 2.

When synchronization is detected using several coded words until synchronization is established, the open/close timing of the switch S may be delayed.

Third Embodiment

Figure 6:
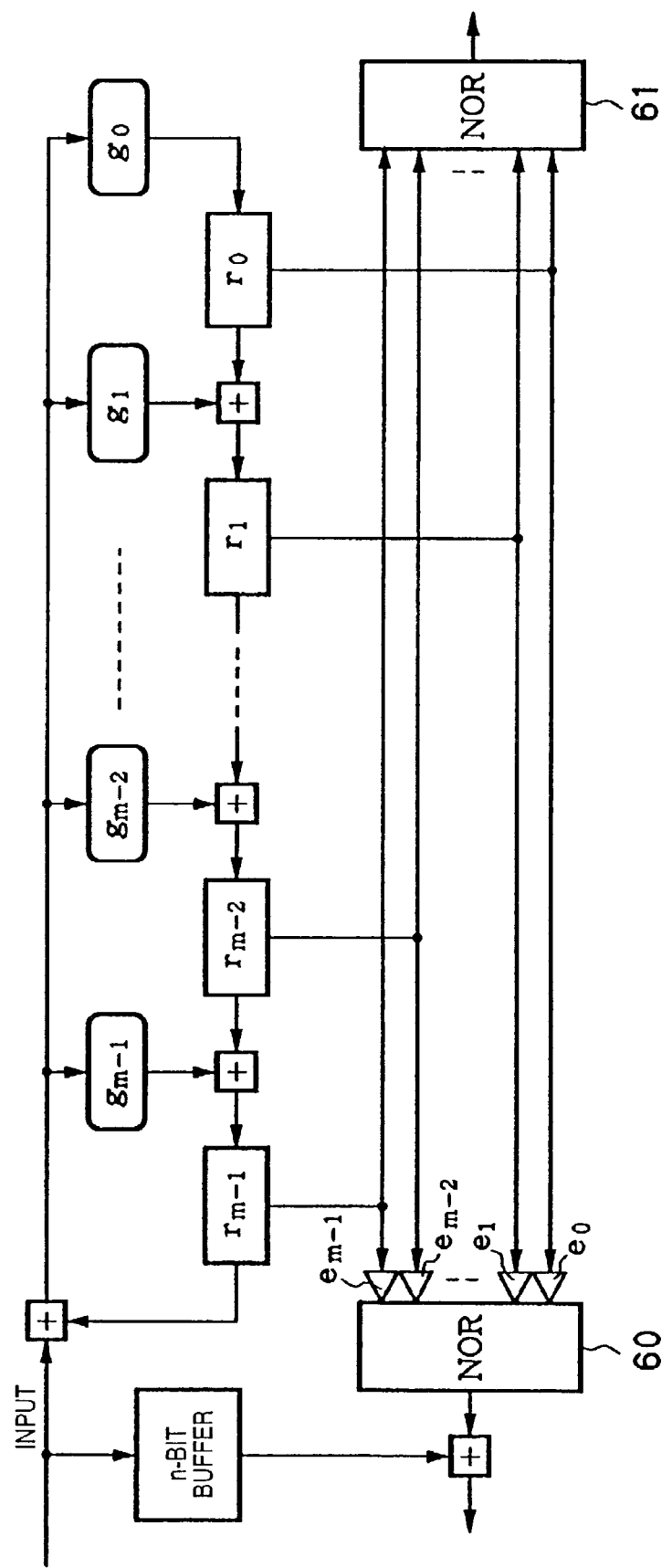
FIG. 6 is a block diagram showing a shortened code decoder according to the third embodiment of the present invention.

The third embodiment will explain a circuit, which can decode a shortened cyclic code by means of a maximum of n shifts, and an n-bit buffer, with reference to FIG. 6.

Let N be the code length of a cyclic code specified by a generator polynomial G(x), and n be the code length obtained by shortening that cyclic code. Then, a syndrome s(x) when an error is at position n−i is given by:

$$s(x)=x^{n-i+m} \bmod G(x) \qquad (10)$$

Therefore, by repeating the process given by equation (4) for each j (j=0, . . . , n−1), a value at the (i−1)-th clock is given by:

$$E'(x) = s(x) \cdot x^j \bmod G(x) \qquad (11)$$
$$= x^{n+m-1} \bmod G(x)$$
$$= \sum_{i=0}^{m-1} e_i \cdot x^i$$

This E'(x) can be obtained in advance based on the shortened code length n and generator polynomial G(x).

Figure 2:
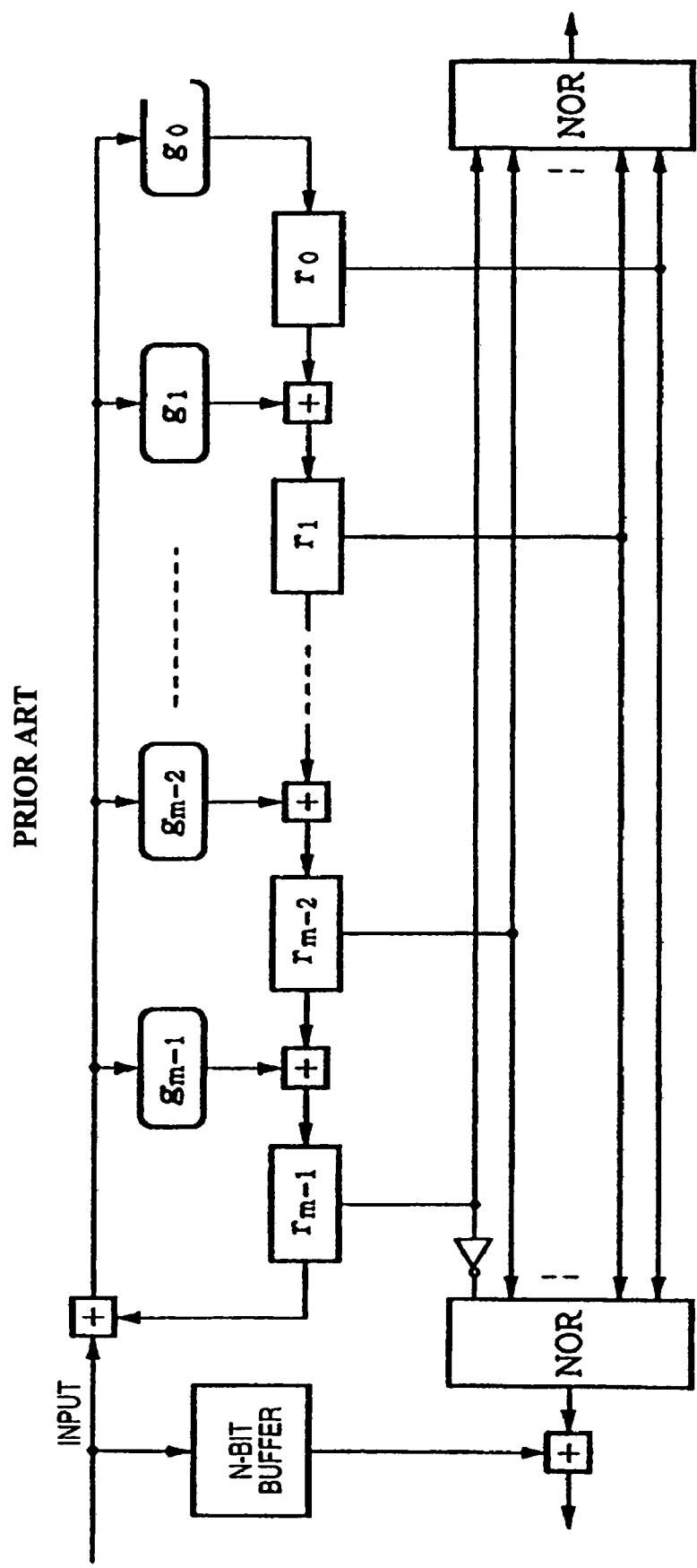
FIG. 2 is a block diagram showing a conventional decoder.

Therefore, when the left $E(x)=x^{m-1}$ detection circuit (NOR circuit 20) in FIG. 2 is replaced by a circuit for detecting $$E'(x)=x^{n+m-1} \bmod G(x)$$

in equation (11), an error position can be detected by a maximum of n shifts. Hence, the received word can be delayed using an n-bit buffer. FIG. 6 shows that circuit. Each triangle including $e_i$(i=0, . . . , m−1) shown in FIG. 6 indicates a circuit for inverting an input when $e_i$=1 (i.e., an inverter when $e_i$=1; a connection when $e_i$=0). The operation of this circuit is basically the same as that in FIG. 2, except that a pattern to be detected by a NOR circuit (60) that executes a NOR logical operation is different from that of the NOR circuit 20, and shifts after s(x)≠0 may be n times.

In general, if a buffer is an L-bit buffer (n≦L≦N), E'(x) to be detected can be given by:

$$E'(x) = s(x) \cdot x^j \bmod G(x) \qquad (12)$$
$$= x^{L+m-1} \bmod G(x)$$

Fourth Embodiment

Figure 7:
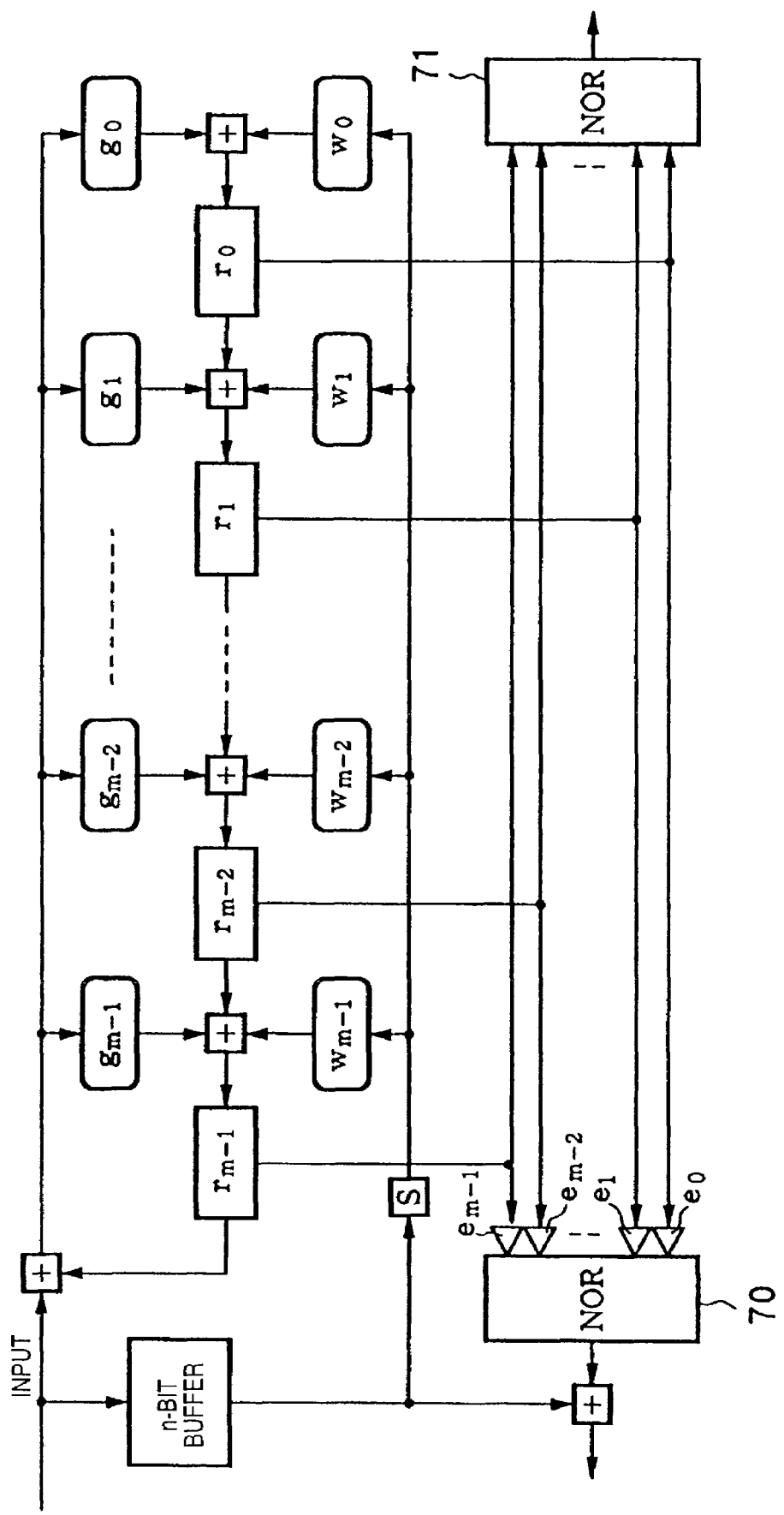
FIG. 7 is a block diagram showing a synchronization detection function/shortened code decoder according to the fourth embodiment of the present invention.

FIG. 7 shows a circuit arrangement that can implement synchronization detection and decoding of a shortened cyclic code according to the fourth embodiment. This circuit can perform synchronization detection and decoding for a coded word sequence shown in FIG. 8A or 8B as in the second embodiment. In this embodiment, a code to be decoded is a shortened code (n<N) as in the third embodiment.

The operation of the circuit shown in FIG. 7 will be described below.

As in the second embodiment, by closing a switch S, a NOR circuit (71) for making NOR logical operations executes "0" detection, thus detecting synchronization. After synchronization is established, the switch S is opened to remove the influence of w(x) of equation (9), and error correction is attained by detecting a specific pattern E'(x) in the third embodiment. In this manner, the circuit shown in FIG. 7 is equivalent to the decoder shown in FIG. 6, and can execute the same decoding operation.

Fifth Embodiment

The fifth embodiment will describe a synchronization detection circuit used when a d-bit parallel input is made or when an input is made faster than the operation clock.

The circuit shown in FIG. 4 as a normal 1-bit serial-input synchronization detection circuit will be explained first.

In the synchronization detector shown in FIG. 4, let $r_{j,i}$ be the value of a register $r_j$ (j=0, . . . , m−1) at timing i, $c_i$ be the input, $e_i$ be the EXOR of the input and the register value $r_{j,i}$, and $c_{i-m}$ be the output from an n-bit buffer. Then, the value of each register at next timing i+1 is given by:

$$e_i = c_i + r_{m-1,i} \qquad (13)$$
$$r_{j,i+1} = e_i \cdot g_j + c_{i-n} \cdot w_j + r_{j-1,i} \qquad (14)$$

Likewise, the value of each register at timing i+2 is given by:

$$e_{i+1} = c_{i+1} + r_{m-1,i+1} \qquad (15)$$
$$r_{j,i+2} = e_{i+1} \cdot g_j + c_{i-n+1} \cdot w_j + r_{j-1,i+1} \qquad (16)$$

Substitution of equation (14) into equation (16) yields:

$$r_{j,i+2} = e_{i+1} \cdot g_j + c_{i-n+1} \cdot w_j + (e_i \cdot g_{j-1} + c_{i-n} w_{j-1} + r_{j-2,i}) \qquad (17)$$

This means that the value $r_{j,i+2}$ of each register at timing i+2 can be directly computed from the value $r_{j-2,i}$ of each register at timing i, $c_i$ and $c_{i+1}$, and the outputs $c_{i-n}$ and $c_{i=n+1}$ from the n-bit buffer.

On the other hand, a value in parentheses in equation (17) is the register value at timing i+1. Hence, a circuit having a logical arithmetic circuit that satisfies the relation of equation (17) can execute a process for two clocks by one clock, compared to the detector shown in FIG. 4. Also, synchronization detection can be made even for a 2-bit parallel input, thus realizing a high-speed process.

In case of the 2-bit parallel input, the n-bit buffer corresponds to two n/2-bit buffers. Also, two "0" detection circuits each configured by a NOR circuit or the like are required so as to inspect the register value at the current timing i and the value in the parentheses of equation (17) at timing i+1.

In general, a register value at timing i+d is given by:

$$e_{i+d-1} = c_{i+d-1} + r_{m-1,i+d-1} \quad (18)$$

$$r_{j,i+d} = e_{i+d-1} \cdot g_j + c_{i-n+d-1} \cdot w_j + r_{j-1,i+d-1} \quad (19)$$

$$= \sum_{k=1}^{d} (e_{i+d-k} \cdot g_{j-k+1} + c_{i+d-k-n} \cdot w_{j-k+1}) + r_{j-d,i}$$

From equation (19), the register value $r_{j,i+d}$ at timing i+d can be directly synthesized from the register value $r_{j-d,i}$ at timing i, d parallel inputs $c_i$ to $c_{i+d-1}$, and d parallel outputs $c_{i-n}$ to $c_{i-n+d-1}$ from the n-bit buffer.

Hence, the circuit having connections described by equation (19) can execute a synchronization detection process for d clocks by one clock. Also, a synchronization detection process for a d-bit parallel input can be implemented. In this case as well, the n-bit buffer corresponds to d n/d-bit buffers. Also, d "0" detection circuits each configured by a NOR circuit and the like are required to detect synchronization at respective timings.

Figure 10A:
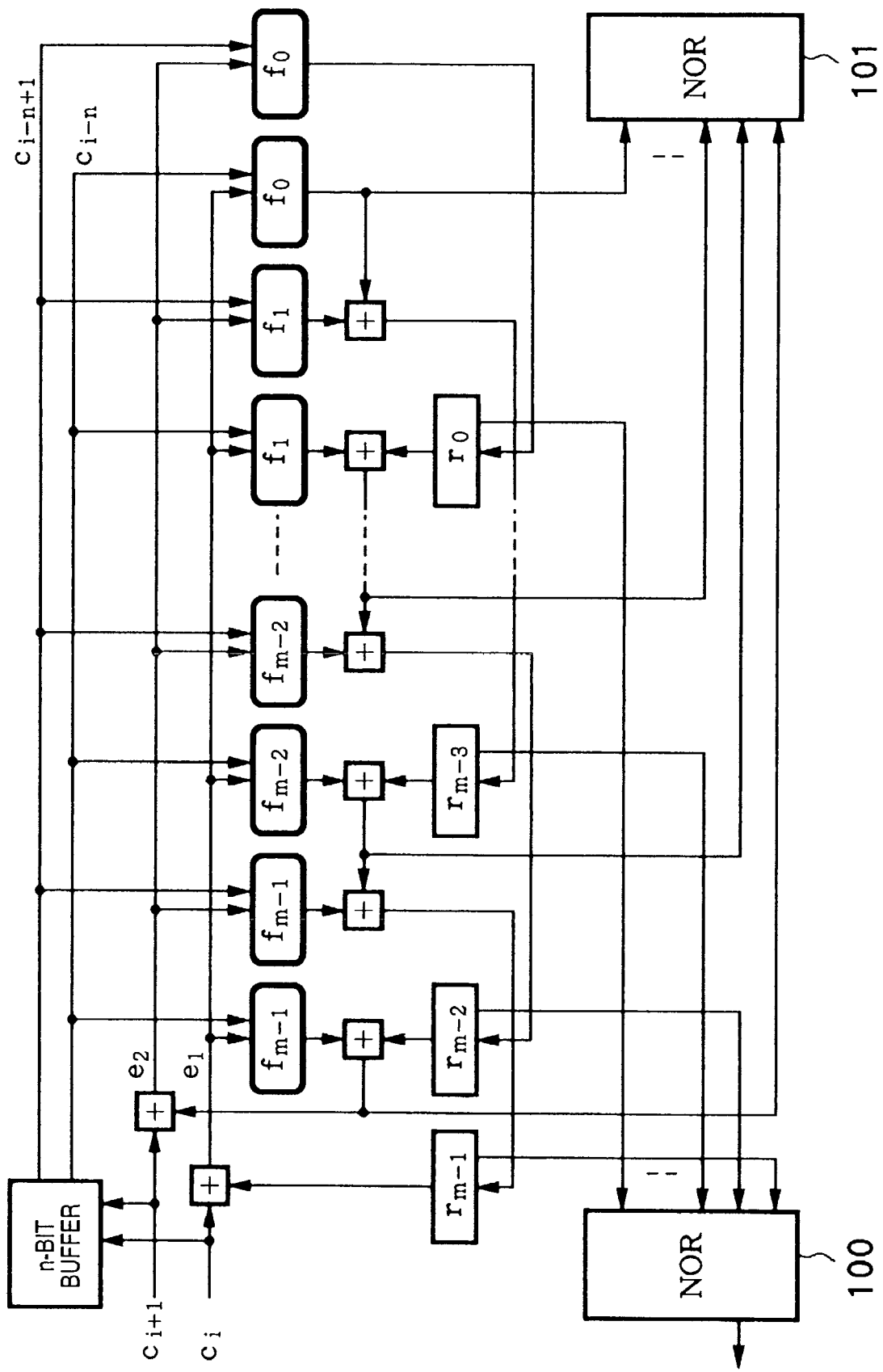
FIG. 10A is a block diagram showing a high-speed synchronization detection circuit according to the fifth embodiment of the present invention.

For the sake of simplicity, for example, FIG. 10A shows a high-speed synchronization detector of this embodiment when d=2.

Figure 9A:
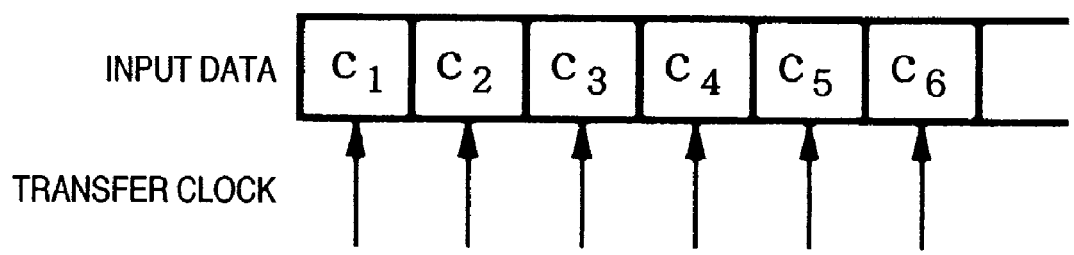
FIG. 9A is a view for explaining high-speed input according to each embodiment of the present invention.
Figure 9B:
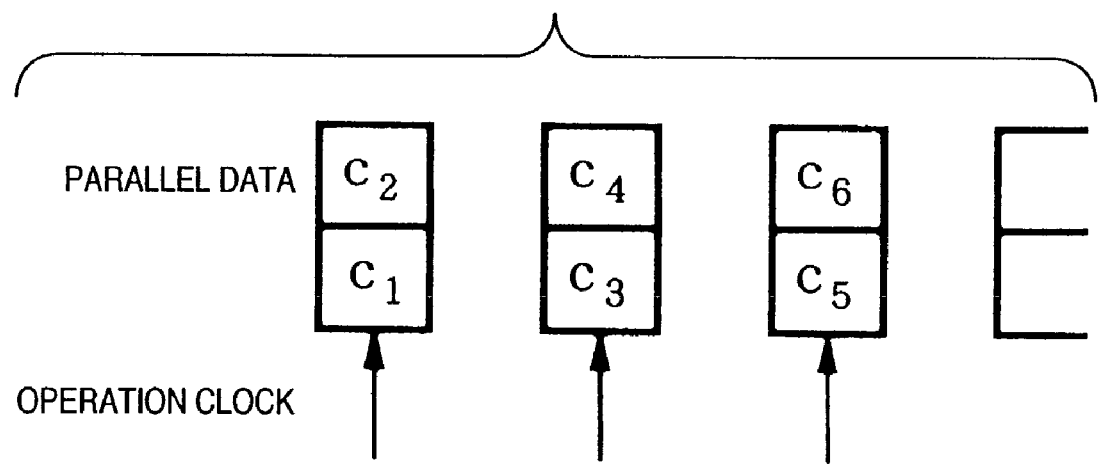
FIG. 9B is a view for explaining parallel input according to each embodiment of the present invention.

The circuit shown in FIG. 10A accepts two information symbols $c_i$ and $c_{i+1}$ (i=1, . . . ) in response to one clock, as shown in FIG. 9B. Also, since an n-bit buffer shown in FIG. 10A corresponds to d n/d-bit buffers, it can simultaneously accept parallelly input $c_i$ to $c_{i+d-1}$, and can simultaneously output $c_{i-n}$ to $c_{i-n+d-1}$, which have been delayed n/d clocks. In this case, since d=2, the buffer simultaneously accepts $c_i$ and $c_{i+1}$, and simultaneously outputs $c_{i-n}$ and $c_{i-n+1}$, which have been delayed n/2 clocks.

Figure 10B:
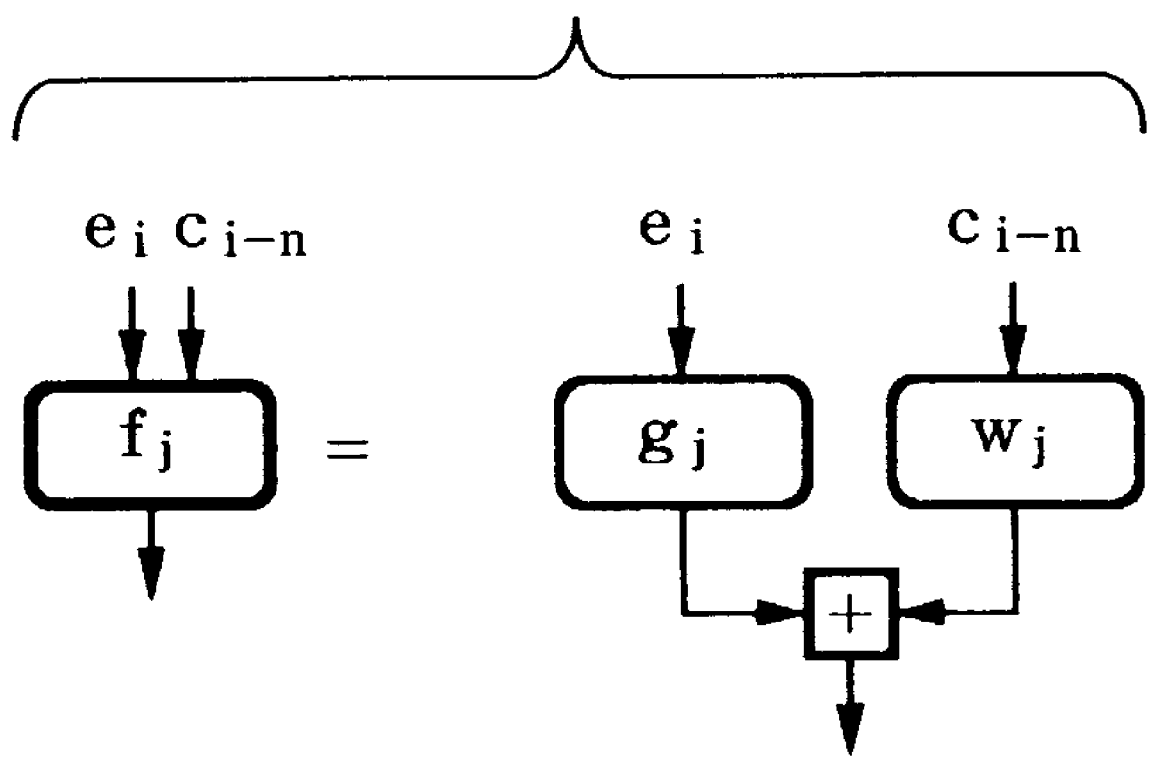
FIG. 10B is a diagram showing the arrangement of a circuit of $f_j$ in FIG. 10A.

The circuit shown in FIG. 10A has a logical arithmetic circuit that satisfies equation (19) when d=2, i.e., a logical arithmetic circuit given by equation (17). Note that a circuit of $f_j$ represented by a double-beveled rectangle in FIG. 10A is a circuit for making an arithmetic operation $$f_j = e_i \cdot g_j + c_{i-n} \cdot w_i$$

for inputs $e_i$ and $c_{i-n}$, as shown in FIG. 10B.

Furthermore, a NOR (101) as a NOR arithmetic circuit in FIG. 10A executes "0" detection for timing i+1, and a NOR (100) as another NOR arithmetic circuit executes "0" detection for timing i. Note that the NOR (100) may receive the input of each register in place of its output to execute "0" detection for timing i+2 in place of timing i.

The operation of the circuit shown in FIG. 10A will be described below. Assume that the bit sequence shown in FIG. 3 is input in turn from bit $c_1$ at the first start position for every 2 bits, as shown in FIG. 9B. If $c_1$ is input to $c_i$ in FIG. 10A, and $c_2$ is input to $c_{i+1}$ (the output from the n-bit buffer is zero), $e_1$ is generated by adding $c_1$ and $r_{m-1}$, and is input to every other $f_j$ circuits in turn from the leftmost $f_{m-1}$ circuit. The outputs from these circuits are $g_j \cdot e_1$ (j=m−1, . . . , 0), and are added to $r_{j-1}$ to generate values $r_{j,2}$ at the next timing.

Of these outputs, an output $r_{m-1,2}$ for j=m−1 (the output from a leftmost EXOR arithmetic unit in the lower stage) is added to $c_2$ as $c_{i+1}$ to generate $e_2$. By inputting $e_2$ to every other $f_j$ circuits in turn from the second leftmost $f_{m-1}$ circuit, values $g_j \cdot e_2$ are output. By adding $g_j \cdot e_2$ to a signal corresponding to $r_{j-1,2}$ at the next timing from the neighboring EXOR arithmetic unit, values $r_{j,3}$ are generated, and are latched by respective registers in response to the next clock.

In synchronism with this clock, $c_3$ and $c_4$ as parallel inputs are input to the lines of $c_i$ and $c_{i+1}$, and $e_3$ and $e_4$ are generated by similar connections, thus repeating the same operations. In this way, a syndrome s(x) is generated in registers in response to a clock next to that at which $c_{n-1}$ and $c_n$ are input.

In synchronism with this clock, $c_{n+1}$ and $c_{n+2}$ are parallelly input from $c_i$ and $c_{i+1}$, and the n-bit buffer parallelly outputs the first inputs $c_1$ and $c_2$, which have been delayed n bits. Hence, the $f_j$ (j=m−1, . . . , 0) circuits output $$g_j \cdot e_{n+1} + w_j \cdot c_1$$

or $$g_j \cdot e_{n+2} + w_j \cdot c_2$$

in accordance with their inputs, and respective outputs from every other EXOR arithmetic units from the leftmost EXOR arithmetic units in the lower stage generate a syndrome $s_2(x)$ at the next timing (however, the immediately preceding inputs of respective registers generate a syndrome $s_3(x)$ at the second next timing).

Hence, if the NOR arithmetic units 100 and 101 detect $$s_1(x)=0$$

as the syndrome at the current timing, or $$s_2(x)=0$$

as the generated syndrome at the next timing, synchronization detection ends. Otherwise, a syndrome $s_3(x)$ is latched in response to the next clock to repeat the same process, thus inspecting $$s_i(x)=0$$

or $$s_{i+1}(x)=0 (i=3, . . . )$$

Upon detecting $$s_i(x)=0$$

or $$s_{i+1}(x)=0,$$

synchronization is detected, and the processing ends.

In FIG. 10A, the case of d=2 has been exemplified for the sake of simplicity. However, as can be seen from the description about equation (19), this embodiment can be implemented for arbitrary d, and the present invention includes cases of arbitrary d.

Sixth Embodiment

The sixth embodiment will describe a circuit arrangement, which can decode a shortened cyclic code by means of a maximum of n/d shifts, and d n/d-bit buffers, even when a d-bit parallel input is made or when an input is made faster than the operation clock.

The circuit shown in FIG. 6 as a 1-bit serial input circuit will be explained first.

In the shortened cyclic code decoder shown in FIG. 6, let $r_{j,I}$ be the value of a register $r_j$ (j=0, ..., m-1) at timing i, $c_i$ be the input, and $e_i$ be the EXOR of the input and the register value $r_{j,I}$. Then, the value of each register at next timing i+1 is given by:

$$e_i = c_i + r_{m-1,i} \quad (21)$$

$$r_{j,i+1} = e_i \cdot g_j + r_{j-1,i} \quad (22)$$

Likewise, the value of each register at timing i+2 is given by:

$$e_{I+1} = c_{i+1} + r_{m-1,i+1} \quad (23)$$

$$r_{j,i+2} = e_{i+1} \cdot g_j + r_{j-1,i+1} \quad (24)$$

Substitution of equation (22) into equation (24) yields:

$$r_{j,i+2} = e_{i+1} \cdot g_j + (e_i \cdot g_{j-1} + r_{j-2,i}) \quad (25)$$

This means that the value $r_{j,i+2}$ of each register at timing i+2 can be directly computed from the value $r_{j-2,i}$ of each register at timing i, and parallel inputs $c_i$ and $c_{i+1}$.

On the other hand, the value in parentheses in equation (25) is the register value at timing i+1.K Hence, a circuit having a logical arithmetic circuit that satisfies the relation of equation (25) can execute a process for two clocks by one clock, compared to the detector shown in FIG. 4. Also, synchronization detection can be made even for a 2-bit parallel input, thus realizing a high-speed process.

Therefore, if there is no error, $$s(x)=0$$

is detected at the (n/2)-th clock at which all inputs have been made, and the processing ends.

If s(x)≠0, parallel inputs are respectively set to be "0" to continue shifts.

Let N be the code length of a cyclic code specified by a generator polynomial G(x), and n be the code length obtained by shortening that cyclic code. Then, a syndrome s(x) when an error is at position n−i is the same as that given by equation (10). After that, by repeating the process given by equation (4) for each j (j=0, ..., n−1), we have:

$$E'(x) = s(x) \cdot x^j \mathrm{mod} G(x)$$
$$= x^{n+m-1} \mathrm{mod} G(x) = \sum e_i \cdot x^i$$

which is the same as that given by equation (11), at the (i−1)-th clock (j=i−1).

In general, if the buffer is an L-bit buffer (n≦L≦N), E'(x) can be given by:

$$E'(x) = s(x) \cdot x^j \bmod G(x) = x^{L+m-1} \bmod G(x) \quad (26)$$

Furthermore, in general, the register value at timing i+d can be given by:

$$e_{i+d-1} = c_{i+d-1} + r_{m-1,i+d-1} \quad (27)$$

$$r_{j,i+d} = e_{i+d-1} \cdot g_j + r_{j-1,i+d-1}$$

$$r_{j,i+d} = e_{i+d-1} \cdot g_j + r_{j-1,i+d-1} \quad (28)$$

$$= \sum_{k=1}^{d} e_{j+d-k} \cdot g_{j-k+1} + r_{j-d,i}$$

From equation (28), the register value $r_{j,i+d}$ at timing i+d can be directly synthesized from the register value $r_{j-d,I}$ at timing i, and d parallel inputs $c_i$ to $c_{i+d-1}$. Hence, the circuit having connections described by equation (28) can execute a decoding process for d clocks by one clock. Also, a decoding process can be implemented for a d-bit parallel input. In this case as well, the n-bit buffer has d n/d-bit buffers. Also, d "0" and E'(x) detection circuits are required since pattern detection for d timings must be done within one clock.

Figure 11A:
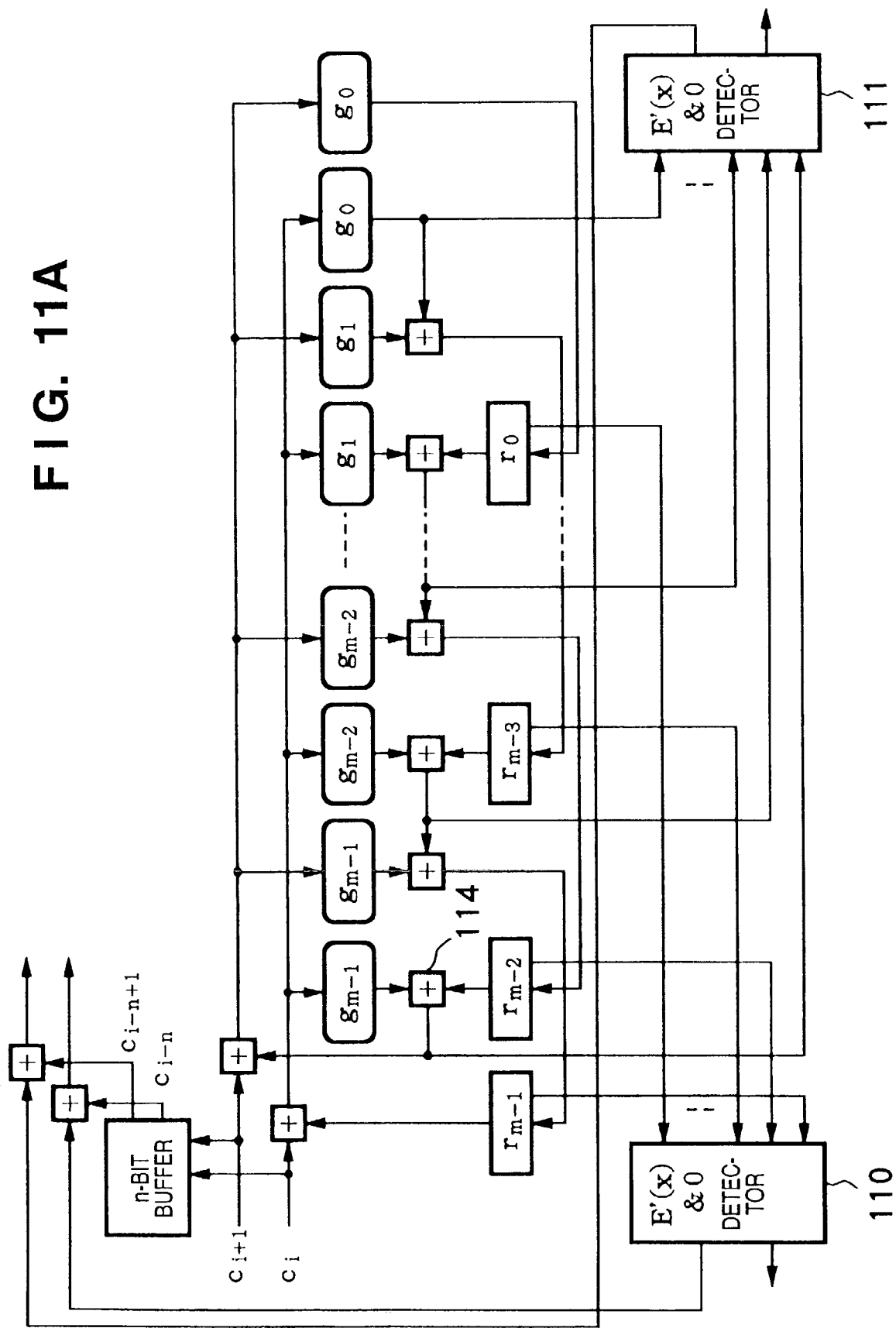
FIG. 11A is a block diagram showing a high-speed shortened code decoder according to the sixth embodiment of the present invention.

FIG. 11A shows a shortened code decoder of this embodiment when d=2. Note that E'(x) & and "0" detectors (110, 111) in FIG. 11A have the same arrangement as the NOR circuits 60 and 61 in FIG. 6, as shown in FIG. 11B.

Figure 11B:
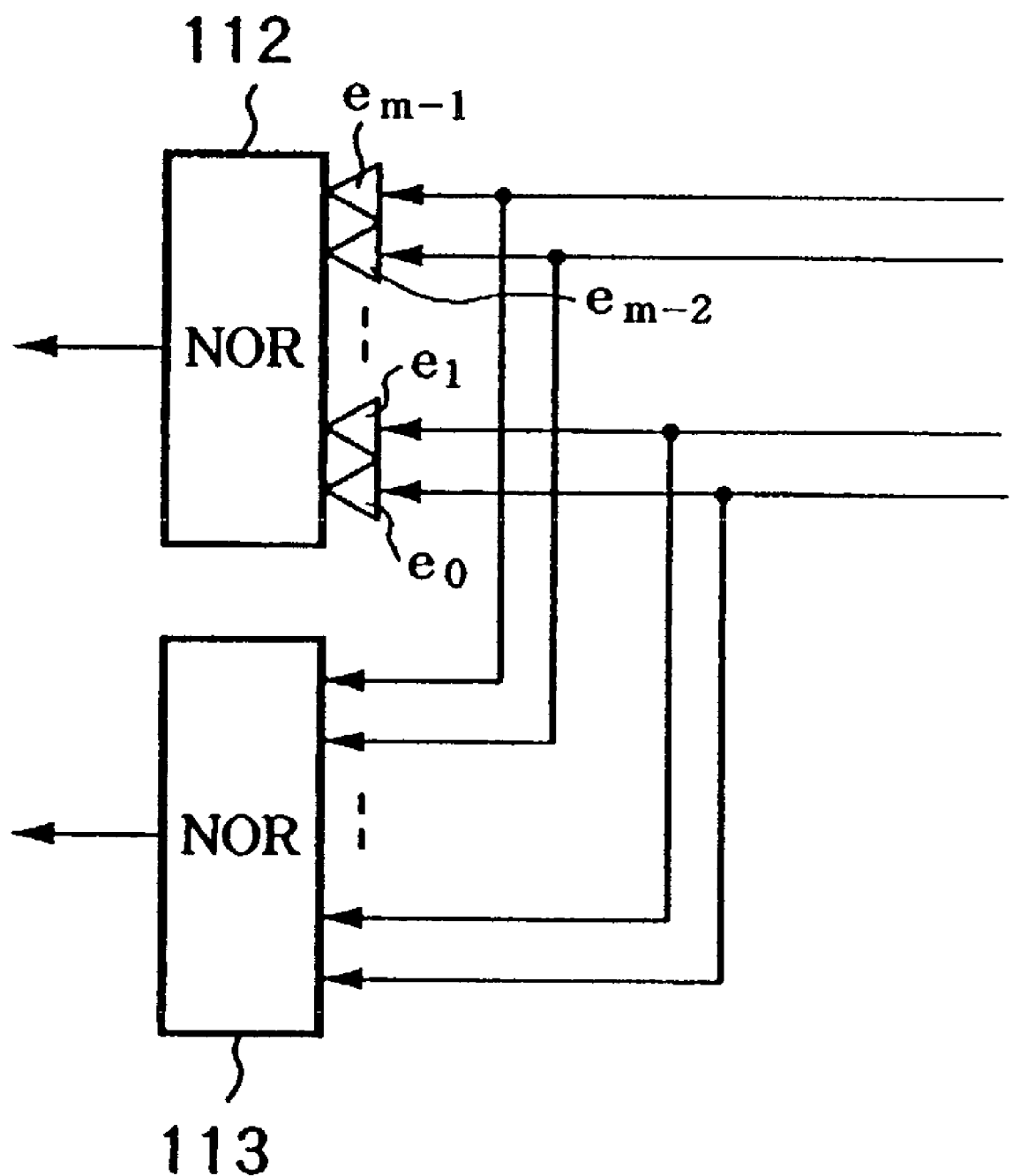
FIG. 11B is a diagram showing the arrangement of an E'(x) & "0" detector in FIG. 11A.

Therefore, a NOR circuit (112) in FIG. 11B can detect:

$$E'(x) = s(x) \cdot x^j \mathrm{mod} G(x)$$
$$= x^{n+m-1} \mathrm{mod} G(x)$$
$$= \sum E_i \cdot x^i$$

Also, a NOR circuit (113) can make "0" detection.

Two E'(x) & "0" detection circuits (110, 111) are required in FIG. 11A to detect for respective timings. Also, an n-bit buffer comprises two n/2-bit buffers.

The operation of the circuit shown in FIG. 11A will be described below.

Assume that the bit sequence shown in FIG. 3 is input in turn from bit $c_1$ at the first start position for every 2 bits, as shown in FIG. 9B.

Assume that $c_1$ is input to $c_i$ in FIG. 11A, and $c_2$ is input to $c_{i+1}$ first. By adding $c_1$ and $r_{m-1}$, $e_1$ is generated, and is input to every other $g_j$ circuits in turn from the leftmost $g_{m-1}$ circuit. Hence, outputs from these circuits are $g_j \cdot e_1$ (j=m−1, ..., 0), and are added to $r_{j-1}$ to generate values $r_{j,2}$ at the next timing.

Of these outputs, an output $r_{m-1,2}$ for j=m−1 (the output from an EXOR arithmetic unit (114)) is added to $c_2$ as $c_{i+1}$ to generate $e_2$.

By inputting $e_2$ to every other $g_j$ circuits in turn from the second leftmost $g_{m-1}$ circuit, values $g_j \cdot e_2$ are output. By adding $g_j \cdot e_2$ to a signal corresponding to $r_{j-1,2}$ at the next timing from the neighboring EXOR arithmetic circuit, values $r_{j,3}$ are generated, and are latched by respective registers in response to the next clock. In synchronism with this clock, $c_3$ and $c_4$ as parallel inputs are input to the lines of $c_i$ and $c_{i+1}$, and $e_3$ and $e_4$ are generated by similar connections, thus repeating the same operations. In this way, a syndrome s(x) is generated in registers in response to a clock next to that at which $c_{n-1}$ and $c_n$ are input. At this time, if the NOR circuit (113) detects s(x)=0, the processing terminates with no error.

However, if s(x)≠0, parallel inputs are respectively set to be "0" to continue the processing until the NOR circuit (112) detects E'(x) or the maximum shift count n/d (d=2 in this case) is reached.

If E'(x) is detected by the E'(x) & "0" detector (110), an error of $c_{i-n}$ is corrected; if it is detected by the E'(x) & "0" detector (111), an error of $c_{i-n+1}$ is corrected, thus ending the process. If an error cannot be detected even after the processing is repeated a maximum of n/2 times, the processing terminates with an uncorrectable error.

In FIG. 11A, the case of d=2 has been exemplified for the sake of simplicity. However, as can be seen from the description about equation (28), this embodiment includes cases of arbitrary d. As has been explained in the second embodiment, if synchronization detection is made based on several coded words in FIG. 8B until synchronization is established, the open/close timing of the switch S can be delayed.

Seventh Embodiment

The seventh embodiment will describe a circuit arrangement that can efficiently execute synchronization detection and decoding of a shortened cyclic code even when a d-bit parallel input is made or when an input is made faster than the operation clock.

This circuit can also execute synchronization detection and decoding operations for a continuous coded word sequence shown in FIG. 8A. However, a code to be decoded in this embodiment is a shortened code (n<N) as in the third or fourth embodiment. Also, assume that coded words in FIG. 8A or 8B are parallelly input every d bits, as shown in FIG. 9B (d=2 in FIG. 9B).

Figure 12A:
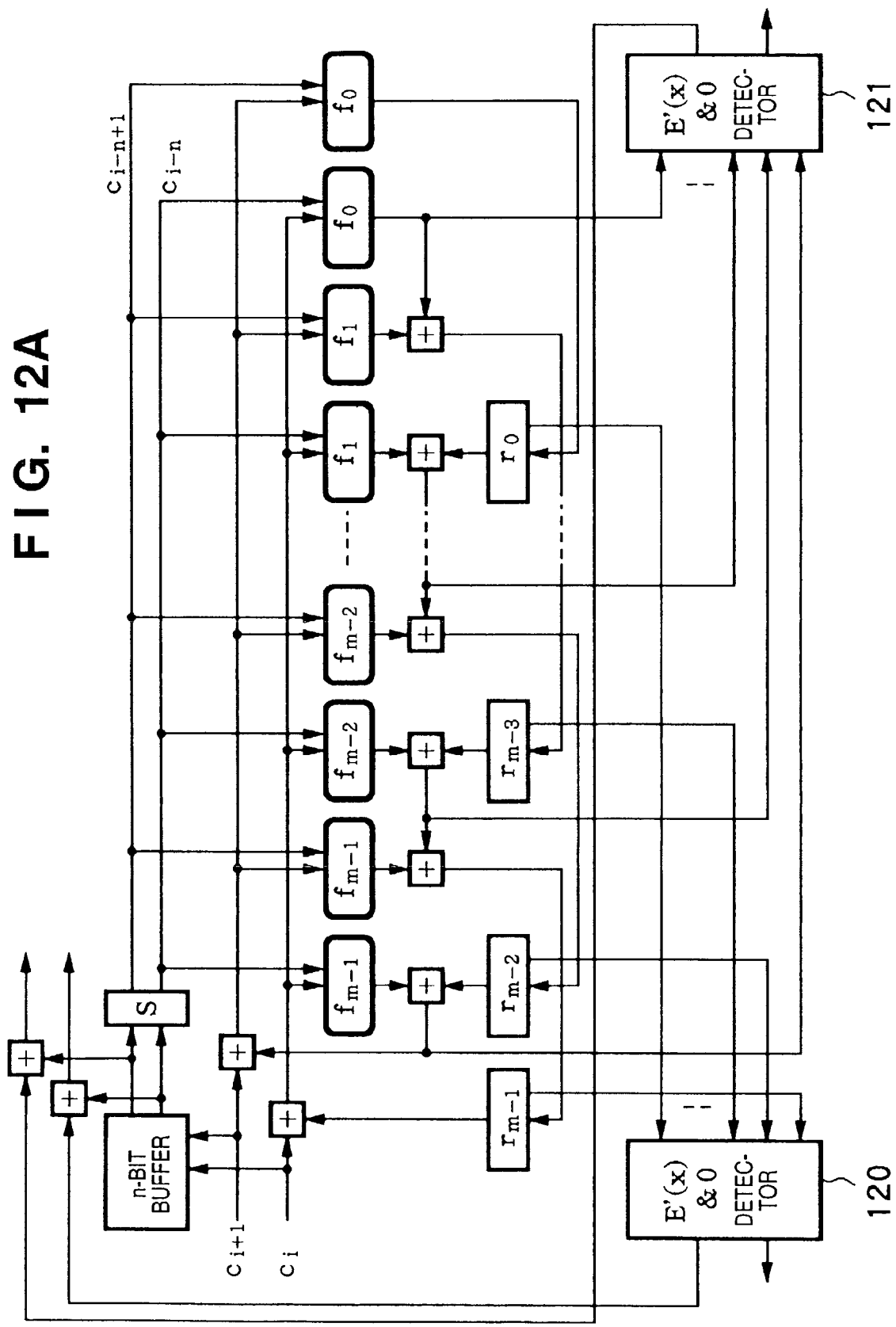
FIG. 12A is a block diagram showing a shortened code decoder with a high-speed synchronization detection function according to the seventh embodiment of the present invention.

FIG. 12A shows a circuit which can attain synchronization detection and decoding of a shortened cyclic code when d=2 for the sake of simplicity. In the circuit shown in FIG. 12A, $g_j$ circuits in FIG. 11A are replaced by $f_j$ circuits shown in FIG. 10B, and the outputs from an n-bit buffer are connected as one more inputs of the $f_j$ circuits via a switch S.

Figure 12B:
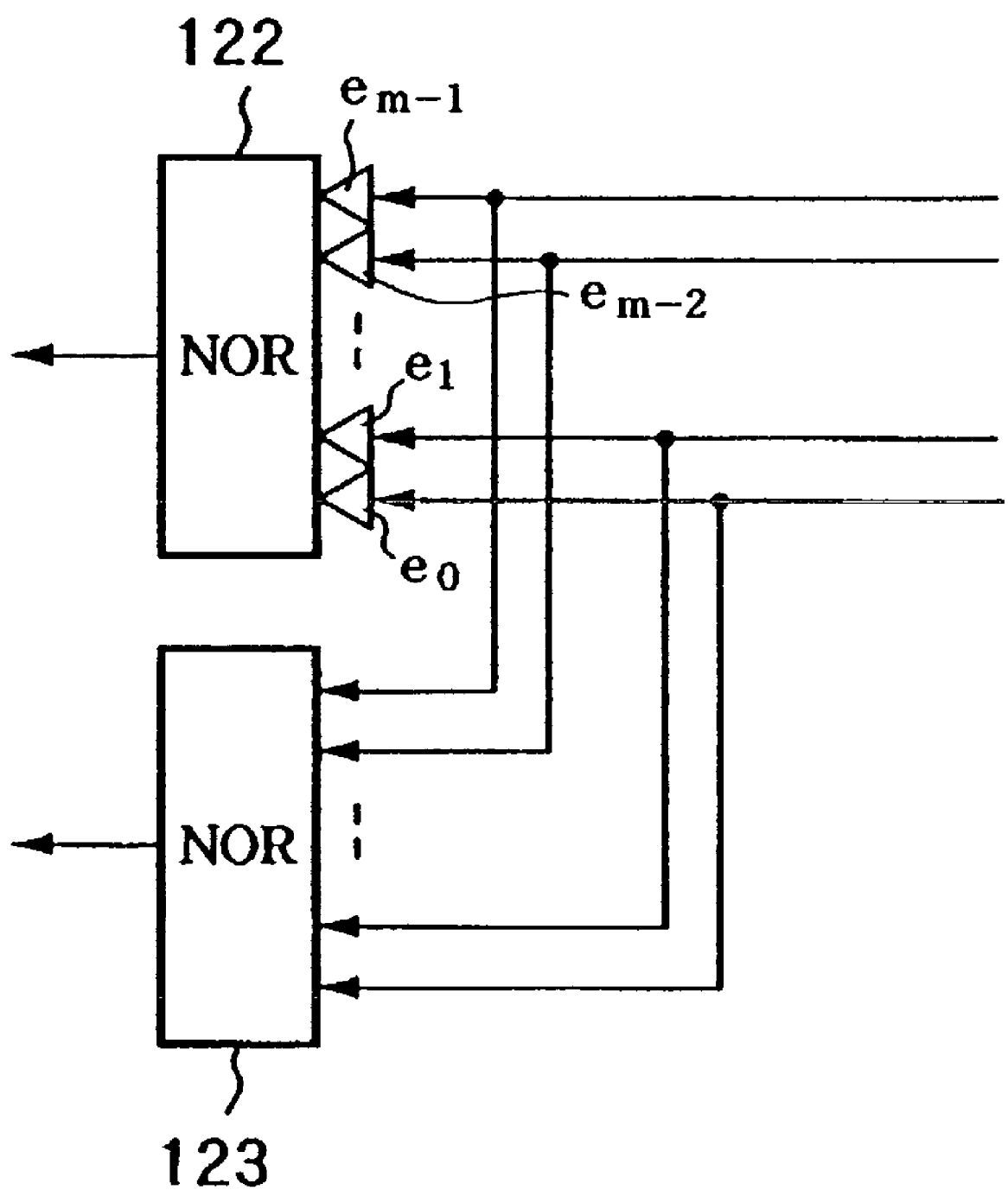
FIG. 12B is a diagram showing the arrangement of an E'(x) & "0" detector in FIG. 12A.

The operation of the circuit shown in FIG. 12A will be described below. FIG. 12B shows the detailed arrangement of each E'(x) & "0" detection circuit (120, 121). A NOR circuit 122 in FIG. 12B detects E'(x), and a NOR circuit 123 detects "0".

In the synchronization detection operation, when the switch S is closed, and the NOR circuit (123) of each E'(x) & "0" detection circuit makes "0" detection, synchronization detection can be attained as in the fifth embodiment.

After synchronization is established, the switch S is opened to remove the influence of w(x) of equation (9) and to convert $f_j$ circuits (j=m−1, . . . , 0) to $g_j$ circuits, and the NOR circuit (122) of each E'(x) & "0" detection circuit detects E'(x), thus decoding a shortened cyclic code as in the sixth embodiment.

In FIG. 12A, the case of d=2 has been exemplified for the sake of simplicity. However, as can be seen from the fifth and sixth embodiments, the embodiment of the present invention can be implemented for arbitrary d, and the present invention includes cases of arbitrary d.

Eighth Embodiment

The eighth embodiment will describe a circuit arrangement that can efficiently execute synchronization detection and decoding of a cyclic code even when a d-bit parallel input is made or when an input is made faster than the operation clock.

This circuit can also execute synchronization detection and decoding operations for a coded word sequence shown in FIG. 8A or 8B. However, a code to be decoded in this embodiment is a non-shortened code (n=N) as in the second embodiment. Also, assume that coded words in FIG. 8A or 8B are parallelly input every d bits, as shown in FIG. 9B (d=2 in FIG. 9B).

Figure 13A:
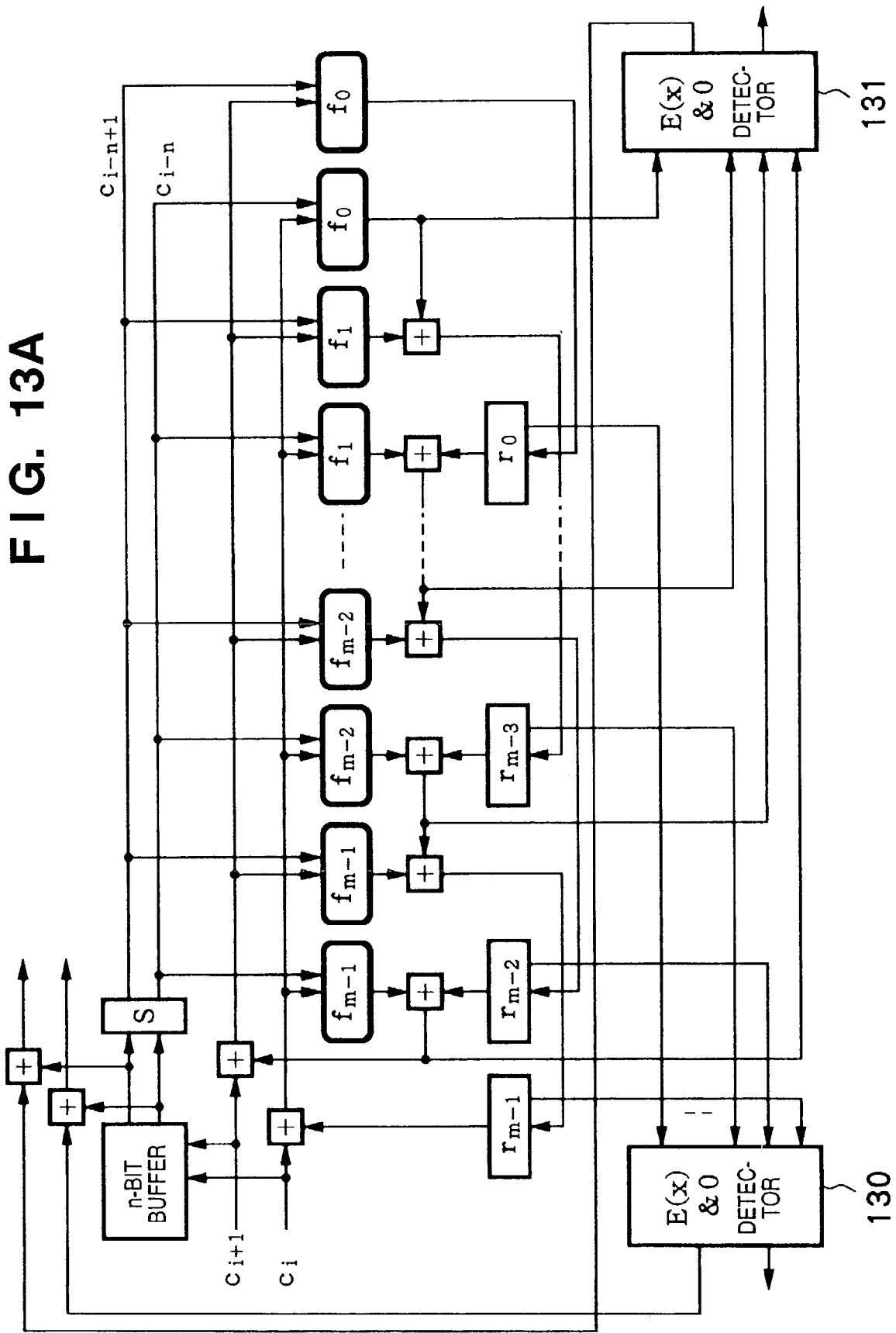
FIG. 13A is a block diagram showing a decoder with a high-speed synchronization detection function according to the eighth embodiment of the present invention.

FIG. 13A shows a circuit which can attain synchronization detection and decoding of a cyclic code when d=2 for the sake of simplicity.

Figure 13B:
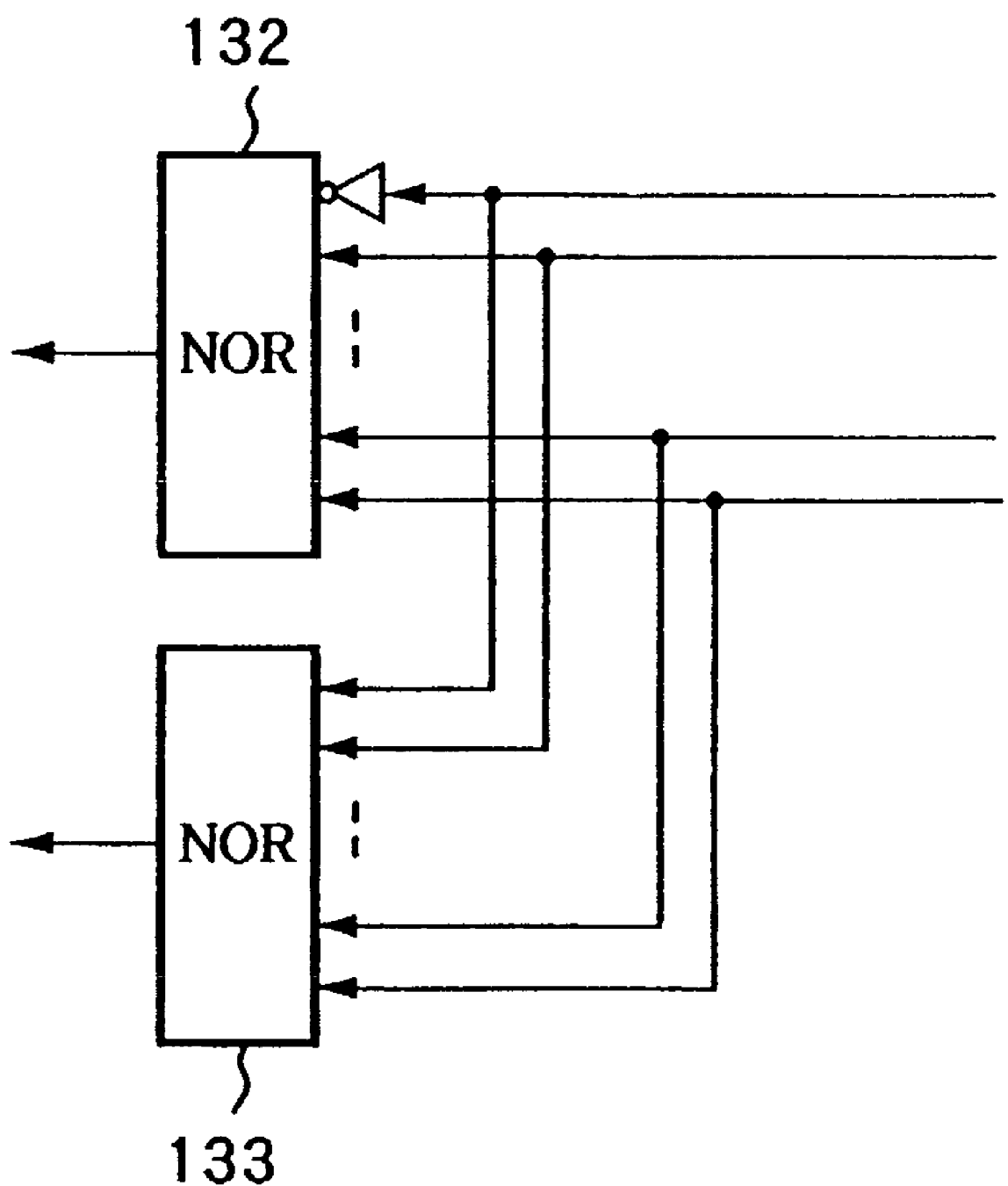
FIG. 13B is a diagram showing the arrangement of an E(x) & "0" detector in FIG. 13A.

In E(x) & "0" detection circuits (130, 131) shown in FIG. 13A, each of the E'(x) & "0" detection circuits (120, 121) shown in FIG. 12A is replaced by an E(x) & "0" detection circuit shown in FIG. 13B. In FIG. 13B, a NOR circuit (132) detects $E(x) = x^{m-1}$, and a NOR circuit (133) detects "0".

The operation of the circuit shown in FIG. 13A will be described below. In the synchronization detection operation, when a switch S is closed, and the NOR circuit (133) in FIG. 13B makes "0" detection, the detection operation can be attained as in the fifth embodiment.

In the synchronization detection operation, when a switch S is closed, and the NOR circuit (133) in FIG. 13B makes "0" detection, the detection operation can be attained as in the fifth embodiment.

After synchronization is established, the switch S is opened to remove the influence of w(x) of equation (9) and to convert $f_j$ circuits (j=m−1, . . . , 0) to $g_j$ circuits, and the NOR circuit (132) of each E(x) & "0" detection circuit detects E'(x), thus also attaining decoding.

Note that an error pattern E(x) for a non-shortened code length N corresponds to a pattern obtained when L=N in equation (26) of the sixth embodiment, and is given by:

$$E(x) = s(x) \cdot x^j \bmod G(x) = x^{m-1} \bmod G(x)$$

Hence, the NOR circuit (132) in FIG. 13B can detect $$E(x) = x^{m-1} \bmod G(x)$$

and, hence, a non-shortened code can be decoded.

In FIG. 13A, the case of d=2 has been exemplified for the sake of simplicity. However, as can be seen from the fifth to seventh embodiments, the embodiment of the present invention can be implemented for arbitrary d, and the present invention includes cases of arbitrary d.

Ninth Embodiment

A process for adding a given pattern to a coded word upon encoding so as to prevent a coded word from becoming all "0"s is often done. Let A(x) be this pattern, and $x^a$ be the added position. Then, a syndrome immediately after the received word is input does not become zero, and is given by:

$$E(x) = x^{m-1} \bmod G(x) \qquad (29)$$
$$= \sum_{j=1}^{m-1} b_j \cdot x^j$$

Hence, in such case, when a "0" detection circuit that detects the absence of errors is replaced by a B(x) detection circuit, similar error detection and synchronization detection can be achieved.

Also, this B(x) detection circuit can be implemented by replacing $e_j$ in E'(x) shown in FIG. 6 and the like by $b_j$.

Furthermore, when error correction is made after error detection and synchronization detection, a pattern B(x) given by equation (29) is added to that syndrome upon completion of input of the received word so as to remove the influences of B(x), thus implementing error correction as in the above embodiments.

Figure 14:
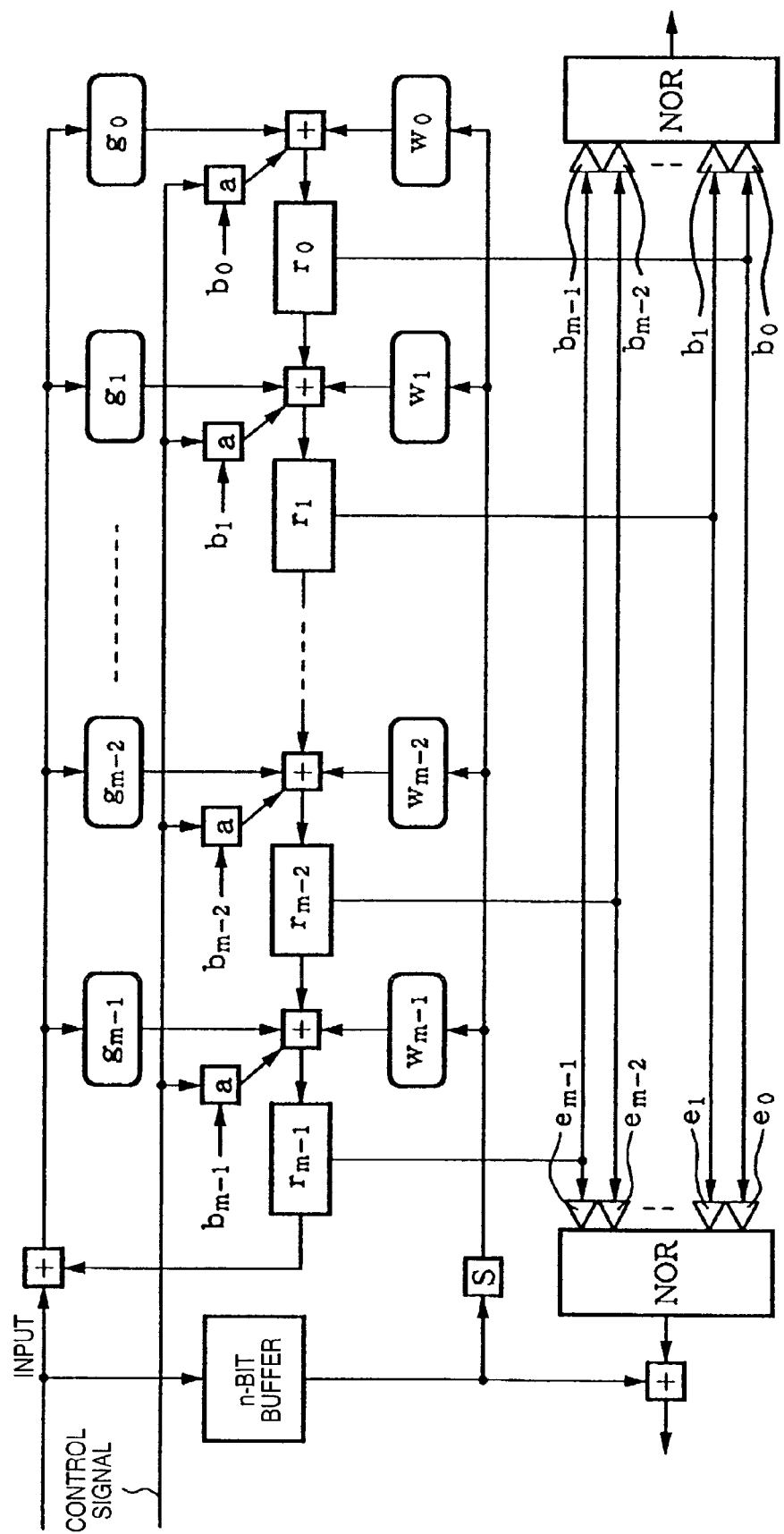
FIG. 14 is a block diagram showing a shortened code decoder according to the ninth embodiment of the present invention.

When such changes are made taking the circuits shown in FIGS. 7 and 12A as an example, circuits shown in FIGS. 14 and 15A are obtained. In FIGS. 14 and 15A, a "control signal" assumes "1" upon completion of input of the received word; otherwise, it assumes "0".

Figure 15B:
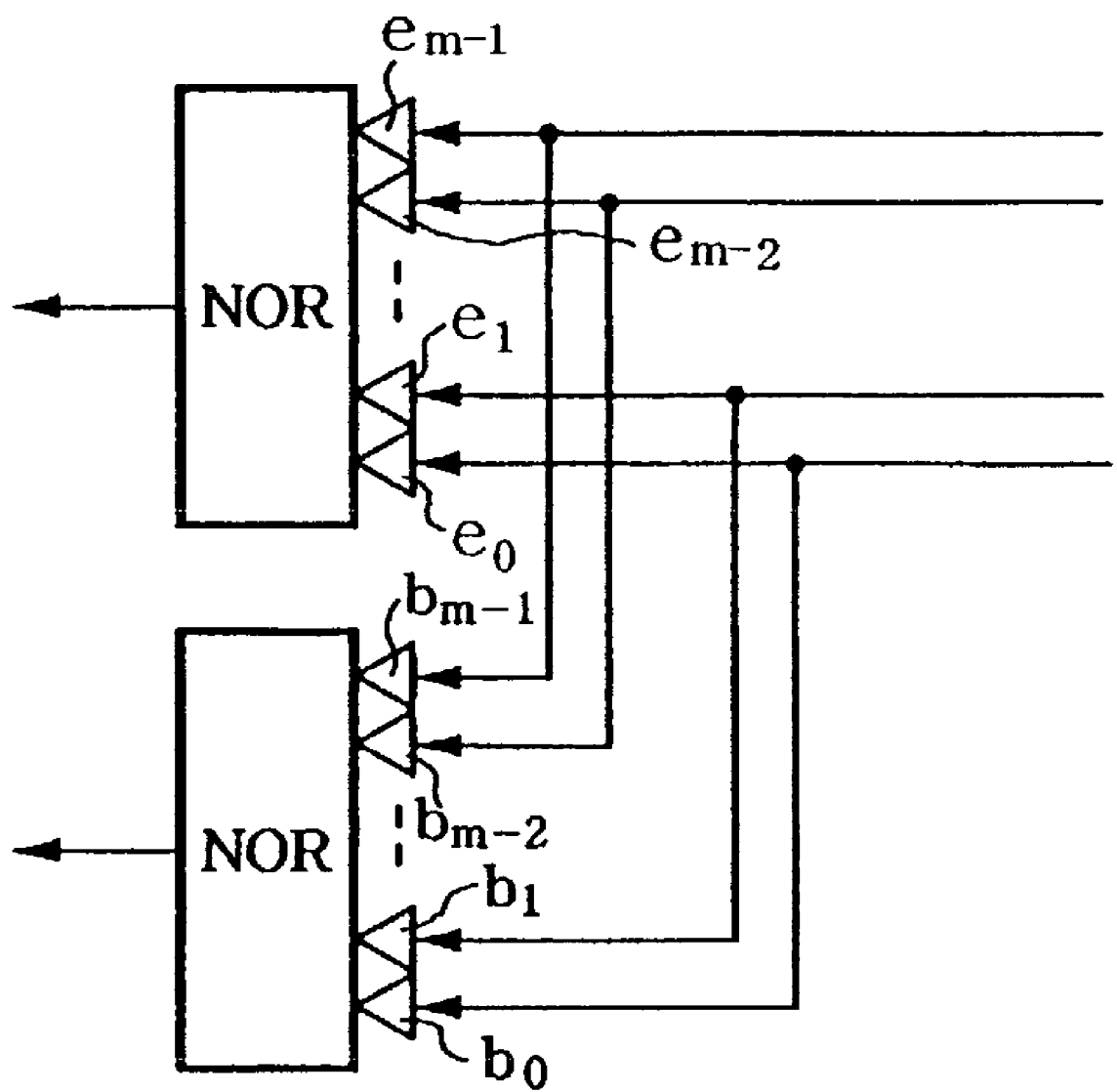
FIG. 15B is a diagram showing the arrangement of an E'(x) & B(x) detector in FIG. 15A.

FIG. 15B shows an E'(x) & B(x) detection circuit in FIG. 15A. The same changes can be applied to the decoders shown in FIGS. 5, 6, and 13A.

10th Embodiment

"0" detection, E(x) detection, and E'(x) detection need not always use a circuit formed by a NOR logic, but may use other circuits if they are equivalent in the sense of Boolean algebra.

Also, upon transferring data faster than the operation clock, as shown in FIG. 9A, even when a circuit has a processing arrangement for converting serial inputs into parallel inputs by serial/parallel conversion, that processing arrangement can be included in an embodiment of the present invention.

Also, each synchronization detection circuit may also be used as an error detector or a decoder as well as synchronization detection.

[Application Examples of Synchronization Detector and Decoder of Embodiments]

Figure 16:
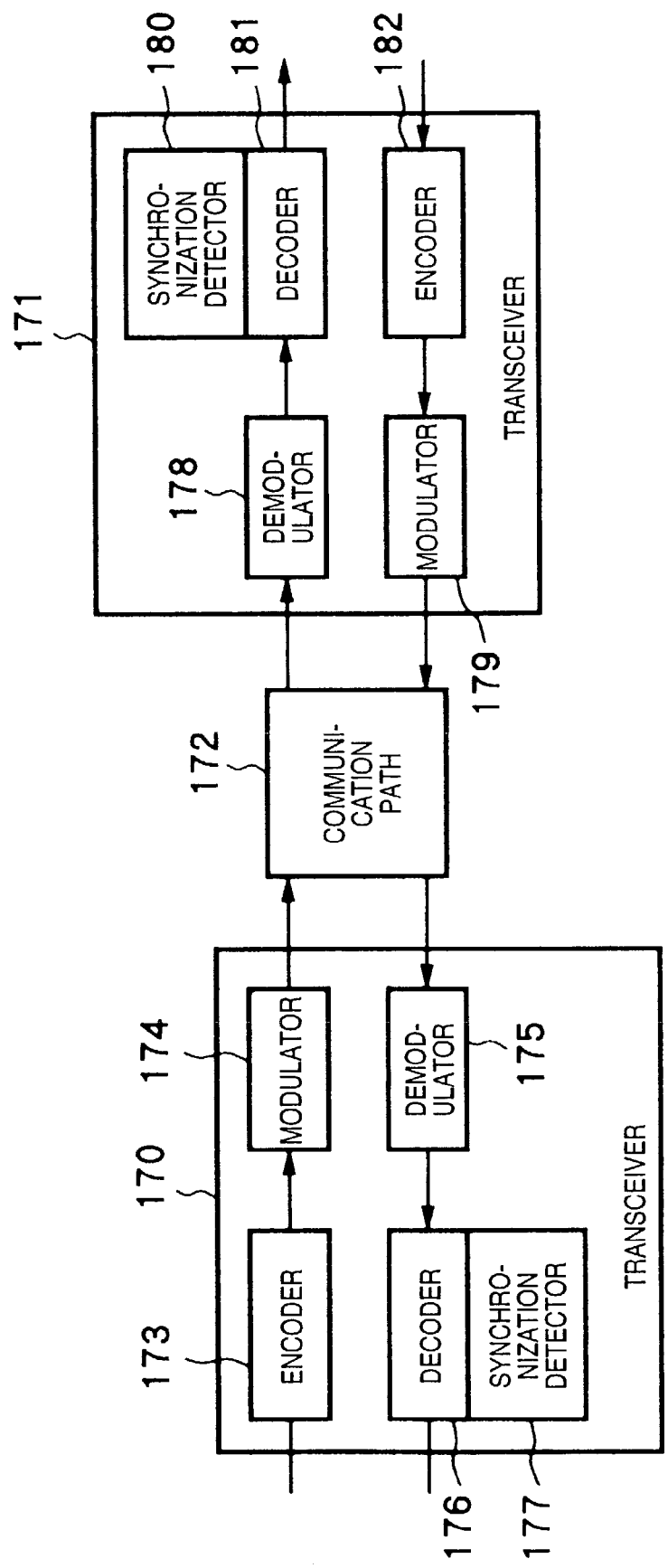
FIG. 16 is a block diagram showing a digital communication system using a synchronization detector according to each embodiment of the present invention.

The synchronization detector described in each of the above embodiments is used to improve the reliability of various digital systems. FIG. 16 shows an embodiment in which each of the aforementioned embodiment of the present invention is applied to a digital communication system.

Digital communication systems include, for example, a LAN (Local Area Network) using the aforementioned ATM, satellite communications, SS (Spread Spectrum) communications, and the like. In such case, a communication path (172) shown in FIG. 16 corresponds to a space, fiber, or the like, and a transceiver (170, 171) corresponds to a communication terminal, computer, or the like.

Referring to FIG. 16, a transceiver 170 comprises an encoder 173 for encoding data, a modulator 174 for modulating encoded data for the purpose of communications, a demodulator 175 for receiving and demodulating a code sequence input via a communication path 172, a synchronization detector 177 for detecting the start position of the demodulated signal, and a decoder 176 for decoding the demodulated signal on the basis of the start position detected by the synchronization detector 177. A transceiver 171 also comprises the same arrangement, i.e., an encoder 182 for encoding data, a modulator 179 for modulating encoded data for the purpose of communications, a demodulator 178 for receiving and demodulating a code sequence input via the communication path 172, a synchronization detector 180 for detecting the start position of the demodulated signal, and a decoder 181 for decoding the demodulated signal on the basis of the start position detected by the synchronization detector 180.

The synchronization detectors 177 and 180, and the decoders 176 and 181 comprise the arrangements described in each of the above embodiments.

In this example, each transceiver includes the synchronization detector according to each embodiment of the present invention, and encoding may be implemented by a known method.

Figure 17:
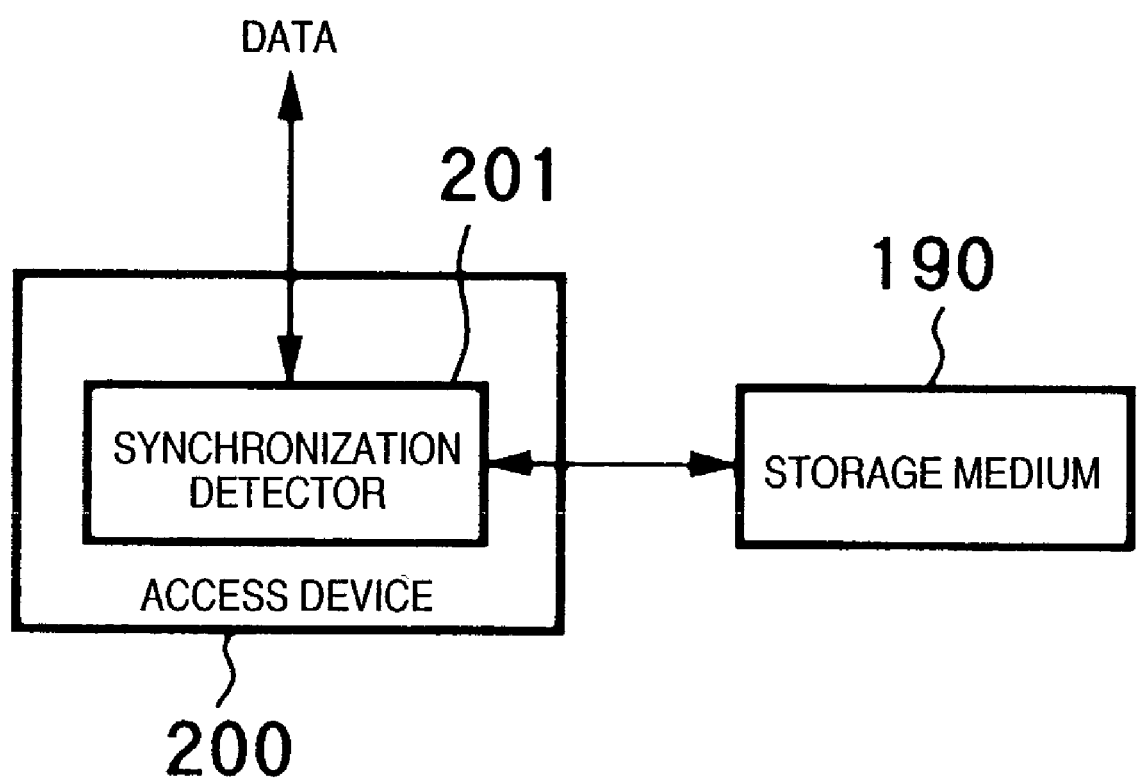
FIG. 17 is a block diagram showing a digital storage system using a synchronization detector according to each embodiment of the present invention.

FIG. 17 shows a case wherein the aforementioned synchronization detector according to each embodiment of the present invention is used in a digital storage system. Digital storage systems include an optical disk apparatus, magneto-optical disk apparatus, and the like.

Referring to FIG. 17, a recording medium 190 stores encoded data. An access device 200 reads out this encoded data, and a synchronization detector 201, which comprises the processing arrangement for synchronization detection described in each of the above embodiments, detects the start position of coded word data.

Note that the present invention may be applied to either a system constituted by a plurality of devices (e.g., a host computer, interface device, reader, printer, and the like), or an apparatus consisting of a single equipment (e.g., a copying machine, facsimile apparatus, or the like).

As described above, according to the embodiments of the present invention, by adding only a circuit associated with w(x), a circuit that can attain synchronization detection by a single detector or decoder can be realized.

As for the circuit which is associated with w(x) and is represented by a beveled rectangle, when the coefficient is 0, the connection itself is not present, and when the coefficient is 1, the circuit can be implemented by only a connection.

Therefore, the component to be added in association with w(x) is only one input of an EXOR logic arithmetic unit that receives the output of $w_j$ (j=0, . . . , m−1).

Also, a decoder, and a decoder with a synchronization detection function, which can decode a shortened cyclic code by means of the number of shifts and buffers corresponding to the shortened code can be realized.

Even when data is transferred faster than the operation clock or when a plurality of bits are simultaneously transferred, a circuit that can cope with such inputs can be implemented by increasing the number of inputs of an EXOR logic arithmetic unit, and adding a "0" detection circuit and specific pattern detection circuit.

As described above, according to the present invention, the start position of a code sequence can be detected quickly by a simple processing arrangement, and the code sequence can be decoded based on the detected start position.

As many apparently widely different embodiments of the present invention can be made without departing from the spirit and scope thereof, it is to be understood that the invention is not limited to the specific embodiments thereof except as defined in the appended claims.

What is claimed is:

1. A start position detection method of receiving a cyclic code sequence with a code length n and detecting a start position of the cyclic code sequence, comprising the steps of:
    inputting a cyclic code sequence $C_i$(i=1, 2, . . .) with a code length n bit by bit;
    generating an i-th code polynomial by adding a $C_{i-1+n}$ to an (i−1)-th syndrome polynomial and shifting a result of addition;
    generating an i-th remainder polynomial by dividing the i-th code polynomial by a generator polynomial;
    generating an i-th syndrome polynomial by subtracting a predetermined polynomial from the i-th remainder polynomial if a value of a preceding position $C_{i-1}$ equals 1;
    determining whether or not the i-th syndrome polynomial equals 0; and
    detecting $C_i$ as the start position of the cyclic code sequence with the code length n if the i-th syndrome polynomial equals 0.

2. The method according to claim 1, wherein the detection step includes the step of detecting the start position of the cyclic code sequence with the code length n on the basis of an OR of all bits of the syndrome generated in said modified syndrome generation step.

3. The method according to claim 1, wherein the predetermined polynomial is generated based on the code length n and the generator polynomial.

4. The method according to claim 3, wherein a predetermined polynomial w(x) generated based on the code length n and the generator polynomial G(x) is generated based by:

$$w(x)=x^{n+m} \bmod G(x) \text{ (}m\text{ is the degree of }G(x)\text{).}$$

5. A decoding method comprising a step of decoding a cyclic code sequence with a code length n on the basis of a start position of the cyclic code sequence with the code length n detected by a start position detection method of claim 1.

6. The method according to claim 5, wherein the decoding step includes the step of detecting an error pattern E(x) for a coded word starting from the start position of the cyclic code sequence with the code length n to correct an error of the coded word.

7. The method according to claim 6, wherein the error pattern E(x) is given by:

$$E(x)=x^m-1.$$

8. A method of receiving a shortened cyclic code sequence obtained by shortening a cyclic code with a code length N based on a generator polynomial G(x) of degree m to a code length n, detecting a start position of the shortened cyclic code sequence, and decoding the shortened cyclic code sequence, comprising the steps of:

inputting a shortened cyclic code sequence $C_i$(i=1, 2, . . . ) with a code length n bit by bit;

generating an i-th code polynomial by adding a $C_{i-1+n}$ to an (i−1)-th syndrome polynomial and shifting a result of addition;

generating an i-th remainder polynomial by dividing the i-th code polynomial by a generator polynomial;

generating an i-th syndrome polynomial by subtracting a predetermined polynomial from the i-th remainder polynomial if a value of a preceding position $C_{i-1}$ equals 1;

determining whether or not the i-th syndrome polynomial equals 0;

detecting $C_i$ as the start position of the shortened cyclic code sequence with the code length n if the i-th syndrome polynomial equals 0; and decoding the shortened cyclic code sequence with the code length n on the basis of the start position of the shortened cyclic code sequence with the code length n detected in said detecting step.

9. The method according to claim 8, wherein the detecting step includes the step of detecting the start position of the cyclic code sequence with the code length n on the basis of an OR of all bits of the syndrome generated in said syndrome generation step.

10. The method according to claim 8, wherein said decoding step includes the step of detecting an error pattern E(x) for a coded word starting from the start position of the shortened cyclic code sequence with the code length n to correct an error of the coded word.

11. The method according to claim 10, wherein the error pattern E(x) is given by:

$$E(x)=x^{n+m-1} \bmod G(x).$$

12. The method according to claim 8, wherein the predetermined polynomial is generated based on the code length n and the generator polynomial.

13. The method according to claim 12, wherein predetermined polynomial w(x) generated based on the code length n and the generator polynomial G(x) is generated based by:

$$w(x)=x^{n+m} \bmod G(x) \text{ (}m\text{ is the degree of }G(x)\text{).}$$

14. A start position detection method of receiving a cyclic code sequence with a code length n and detecting a start position of the cyclic code sequence, comprising the steps of:

inputting a cyclic code sequence $C_i$(i=1, 2, . . . ) with a code length n, d bits at a time;

generating an i-th code polynomial by adding a $C_{i-1+n}$ to an (i−1)-th syndrome polynomial and shifting a result of addition;

generating an i-th remainder polynomial by dividing the i-th code polynomial by a generator polynomial;

generating an i-th syndrome polynomial by subtracting a predetermined polynomial from the i-th remainder polynomial if a value of a preceding position $C_{i-1}$ equals 1;

determining whether or not the i-th syndrome polynomial equals 0; and detecting $C_i$ as the start position of the cyclic code sequence with the code length n if the i-th syndrome polynomial equals 0.

15. A decoding method comprising a step of decoding a cyclic code sequence with a code length n on the basis of a start position of the cyclic code sequence with the code length n detected by a start position detection method of claim 14.

16. The method according to claim 15, wherein said decoding step includes the step of detecting an error pattern E(x) for a coded word starting from the start position of the cyclic code sequence with the code length n to correct an error of the coded word.

17. The method according to claim 16, wherein the error pattern E(x) is given by:

$$E(x)=x^m-1.$$

18. A method of receiving a shortened cyclic code sequence obtained by shortening a cyclic code with a code length N based on a generator polynomial G(x) of degree m to a code length n, detecting a start position of the shortened cyclic code sequence, and decoding the shortened cyclic code sequence, comprising the steps of:

inputting a shortened cyclic code sequence $C_i$(i=1, 2, . . . ) with a code length n, d bit at a time;

generating an i-th code polynomial by adding a $C_{i-1+n}$ to an (i−1)-th syndrome polynomial and shifting a result of addition;

generating an i-th remainder polynomial by dividing the i-th code polynomial by a generator polynomial;

generating an i-th syndrome polynomial by subtracting a predetermined polynomial from the i-th remainder polynomial if a value of a preceding position $C_{i-1}$ equals 1;

determining whether or not the i-th syndrome polynomial equals 0;

detecting $C_i$ as the start position of the shortened cyclic code sequence with the code length n if the i-th syndrome polynomial equals 0; and decoding the shortened cyclic code sequence with the code length n on the basis of the start position of the shortened cyclic code sequence with the code length n detected in said detecting step.

19. A method of receiving a cyclic code sequence including a coded word with a code length n in which a first predetermined pattern A(x) is added at a position $x^a$, and detecting a start position of the cyclic code sequence, comprising the steps of:

inputting a shortened cyclic code sequence $C_i$(i=1, 2, . . . ) with a code length n bit by bit;

generating an i-th code polynomial by adding a $C_{i-1+n}$ to an (i−1)-th syndrome polynomial and shifting a result of addition;

generating an i-th remainder polynomial by dividing the i-th code polynomial by a generator polynomial;

generating an i-th syndrome polynomial by subtracting a predetermined polynomial from the i-th remainder polynomial if a value of a preceding position $C_{i-1}$ equals 1;

determining whether or not the i-th syndrome polynomial is equal to a second predetermined pattern B(x); and detecting $C_i$ as the start position of the cyclic code sequence if the if the i-th syndrome polynomial obtained in said syndrome generation step is equal to the second predetermined patterned B(x).

20. The method according to claim 19, wherein the second predetermined pattern B(x) is given by:

$$B(x)=A(x)\ x^{a+m} \bmod G(x) \text{ (a: the degree of } G(x)).$$

21. A decoding method comprising a step of decoding a cyclic code sequence with a code length n on the basis of a start position of the cyclic code sequence with the code length n detected by a start position detection method of claim 19.

22. The method according to claim 21, wherein said decoding step includes the step of detecting an error pattern E(x) for a coded word starting from the start position of the cyclic code sequence with the code length n to correct an error of the coded word.

23. The method according to claim 22, wherein the error pattern E(x) is given by:

$$E(x)=B(x).$$

24. A method of receiving a shortened cyclic code obtained by shortening, to a code length n, a cyclic code with a code length N in which a first predetermined pattern is added at a position $x^a$ and which is based on a generator polynomial G(x) of degree m, detecting a start position of the shortened cyclic code sequence, and decoding the shortened cyclic code sequence, comprising the steps of:

inputting a shortened cyclic code sequence $C_i$(i=1, 2, . . . ) with a code length n bit by bit;

generating an i-th code polynomial by adding a $C_{i-1+n}$ to an (i−1)-th syndrome polynomial and shifting a result of addition;

generating an i-th remainder polynomial by dividing the i-th code polynomial by a generator polynomial;

generating an i-th syndrome polynomial by subtracting a predetermined polynomial from the i-th remainder polynomial if a value of a preceding position $C_{i-1}$ equals 1;

determining whether or not the i-th syndrome polynomial equals 0;

detecting $C_i$ as the start position of the shortened cyclic code sequence with the code length n if the i-th syndrome polynomial equals 0; and decoding the shortened cyclic code sequence with the code length n on the basis of the start position of the shortened cyclic code sequence with the code length n detected in said detecting step.

25. The method according to claim 24, wherein said decoding step includes the step of detecting an error pattern E(x) for a coded word starting from the start position of the shortened cyclic code sequence with the code length n to correct an error of the coded word.

26. The method according to claim 25, wherein the error pattern E(x) is given by:

$$E(x)=A(x)\cdot x^{a+m} \bmod G(x).$$

27. The method according to claim 24, wherein said decoding step includes the step of detecting an error pattern E(x) for a coded word starting from the start position of the shortened cyclic code sequence with the code length n to correct an error of the coded word.

28. The method according to claim 27, wherein the error pattern E(x) is given by:

$$E(X)=A(x)x^{a+m} \bmod G(X).$$

29. An apparatus for receiving a cyclic code sequence with a code length n and detecting a start position of the cyclic code sequence, comprising:

input means for inputting a cyclic code sequence C (i=1, 2, . . . ) with a code length n bit by bit;

first generation means for generating an i-th code polynomial by adding a $C_{i-1+n}$ to an (i+1)-th syndrome polynomial and shifting a result of addition;

second generation means for generating an i-th remainder polynomial by dividing the i-th code polynomial by a generator polynomial;

syndrome generation means for generating an i-th syndrome polynomial by subtracting a predetermined polynomial from the i-th remainder polynomial if a value of a preceding position $C_{i-1}$ equals 1;

determination means for determining whether or not the i-th syndrome polynomial equals 0; and detection means for detecting $C_i$ as the start position of the cyclic code sequence with the code length n if the i-th syndrome polynomial equals 0.

30. A decoding apparatus comprising decoding means for decoding a cyclic code sequence with a code length n on the basis of a start position of the cyclic code sequence with the code length n detected by a start position detection apparatus of claim 29.

31. A decoding apparatus for receiving a shortened cyclic code sequence obtained by shortening a cyclic code with a code length N based on a generator polynomial G(x) of degree m to a code length n, detecting a start position of the shortened cyclic code sequence, and decoding the shortened cyclic code sequence, comprising:

input means for inputting a shortened cyclic code sequence C (i=1, 2, . . . ) with a code length n bit by bit;

first generation means for generating an i-th code polynomial by adding a $C_{i-1+n}$ to an (i+1)-th syndrome polynomial and shifting a result of addition;

second generation means for generating an i-th remainder polynomial by dividing the i-th code polynomial by a generator polynomial;

syndrome generation means for generating an i-th syndrome polynomial by subtracting a predetermined polynomial from the i-th remainder polynomial if a value of a preceding position $C_{i-1}$ equals 1;

determination means for determining whether or not the i-th syndrome polynomial equals 0;

detection means for detecting $C_i$ as the start position of the shortened cyclic code sequence with the code length n if the i-th syndrome polynomial equals 0; and decoding means for decoding the shortened cyclic code sequence with the code length n on the basis of the start position of the shortened cyclic code sequence with the code length n detected by said detection means.

32. An apparatus for receiving a cyclic code sequence with a code length n and detecting a start position of the cyclic code sequence, comprising:

input means for inputting a cyclic code sequence $C_i$(i=1, 2, . . . ) with a code length n, d bits at a time;

first generation means for generating an i-th code polynomial by adding a $C_{i-1+n}$ to an (i−1)-th syndrome polynomial and shifting a result of addition;

second generation means for generating an i-th remainder polynomial by dividing the i-th code polynomial by a generator polynomial;

syndrome generation means for generating an i-th syndrome polynomial by subtracting a predetermined polynomial from the i-th remainder polynomial if a value of a preceding position $C_{i-1}$ equals 1; and determining whether or not the i-th syndrome polynomial equals 0; and detection means for detecting $C_i$ as the start position of the cyclic code sequence with the code length n if the i-th syndrome polynomial equals 0.

33. A decoding. apparatus comprising decoding means for decoding a cyclic code sequence with a code length n on the basis of a start position of the cyclic code sequence with the code length n detected by a start position detection apparatus of claim 32.

34. A decoding apparatus for receiving a shortened cyclic code sequence obtained by shortening a cyclic code with a code length N based on a generator polynomial G(x) of degree m to a code length n, detecting a start position of the shortened cyclic code sequence, and decoding the shortened cyclic code sequence, comprising:

input means for inputting the shortened cyclic code sequence $C_i$(i=1, 2, . . . ) with the code length n, d bits at a time;

first generation means for generating an i-th code polynomial by adding a $C_{i-1+n}$ to an (i−1)-th syndrome polynomial and shifting a result of addition;

second generation means for generating an i-th remainder polynomial by dividing the i-th code polynomial by a generator polynomial syndrome generation means for generating an i-th syndrome polynomial by subtracting a predetermined polynomial from the i-th remainder polynomial if a value of a preceding position $C_{i-1}$ equals 1;

determination means for determining whether or not the i-th syndrome polynomial equals 0;

detection means for detecting $C_i$ as the start position of the shortened cyclic code sequence with the code length n if the i-th syndrome polynomial equals 0; and decoding means for decoding the shortened cyclic code sequence with the code length n on the basis of the start position of the shortened cyclic code sequence with the code length n detected by said detection means.

35. An apparatus for receiving a cyclic code sequence including a coded word with a code length n in which a first predetermined pattern A(x) is added at a position $x^a$, and detecting a start position of the cyclic code sequence, comprising:

input means for inputting a cyclic code sequence $C_i$(i=1, 2, . . . ) with a code length n bit by bit;

first generation means for generating an i-th code polynomial by adding a $C_{i-1+n}$ to an (i−1)-th syndrome polynomial and shifting a result of addition;

second generation means for generating an i-th remainder polynomial by dividing the i-th code polynomial by a generator polynomial;

syndrome generation means for generating an i-th syndrome polynomial by subtracting a predetermined polynomial from the i-th remainder polynomial if a value of a preceding position $C_{i-1}$ equals 1; and determination means for determining whether or not the i-th syndrome polynomial is equal to a second predetermined pattern B(x); and detection means for detecting $C_i$ the start position of the cyclic code sequence if the i-th syndrome polynomial obtained by modified syndrome generation means is equal to the second predetermined pattern B(x).

36. A decoding apparatus comprising decoding means for decoding a cyclic code sequence with a code length n on the basis of a start position of the cyclic code sequence with the code length n detected by a start position detection apparatus of claim 35.

37. A decoding apparatus for receiving a shortened cyclic code obtained by shortening, to a code length n, a cyclic code with a code length N in which a first predetermined pattern is added at a position $x_a$ and which is based on a generator polynomial G(x) of degree m, detecting a start position of the shortened cyclic code sequence, and decoding the shortened cyclic code sequence, comprising:

input means for inputting a shortened cyclic code sequence $C_i$(i=1, 2, . . . ) with a code length n bit by bit;

first generation means for generating an i-th code polynomial by adding a $C_{i-1+n}$ to an (i−1)-th syndrome polynomial and shifting a result of addition;

second generation means for generating an i-th remainder polynomial by dividing the i-th code polynomial by a generator polynomial;

syndrome generation means for generating an i-th syndrome polynomial by subtracting a predetermined polynomial from the i-th remainder polynomial if a value of a preceding position $C_{i-1}$ equals 1;

determination means for determining whether or not the i-th syndrome polynomial equals 0;

detection means for detecting $C_i$ as the start position of the shortened cyclic code sequence with the code length n if the i-th syndrome polynomial equals 0; and decoding means for decoding the shortened cyclic code sequence with the code length n on the basis of the start position of the shortened cyclic code sequence with the code length n detected by said detection means.

* * * * *

UNITED STATES PATENT AND TRADEMARK OFFICE
CERTIFICATE OF CORRECTION

PATENT NO. : 7,103,827 B2
APPLICATION NO. : 10/233504
DATED : September 5, 2006
INVENTOR(S) : Keiichi Iwamura It is certified that error appears in the above-identified patent and that said Letters Patent is hereby corrected as shown below:

COLUMN 3:

Line 8, "$S_1(X)$" should read --$S_i(X)$--; and
Line 52, "$C_{1+n}$," should read --$C_{i+n}$,--.

COLUMN 4:

Line 36, "$C_{1-1+n}$" should read --$C_{i-1+n}$--; and
Line 40, "$C_{1+n}$," should read --$C_{i+n}$,--.

COLUMN 7:

Line 8, "$C_{1-1}$" should read --$C_{i-1}$--.

COLUMN 10:

Line 1, "$S_{l-1}(x)$" should read --$S_{i-1}(x)$--;
Line 14, "$C_{1+n-2}$," should read --$C_{i+n-2}$,--;
Line 15, "$S_{i-1}(x){\cdot}x+c_{i+n-1}{\cdot}x^m)$ mod $G(x)$" should read
--$S_{i-1}(x){\cdot}x+c_{i+n-1}{\cdot}x^{m)}$ mod $G(x)$--; and
Line 30, "$S_{i-1}(x){\cdot}x+c_{l+n-1}{\cdot}x^m)$ mod $G(x)$" should read
--$S_{i-1}(x){\cdot}x+c_{i+n-1}{\cdot}x^m)$ mod $G(x)$--.

COLUMN 11:

Line 63, "$\sum_{i=0}^{m-1} e_i \cdot x^{\prime}$" should read --$\sum_{i=0}^{m-1} e_i \cdot x^i$--.

COLUMN 12:

Line 11, "$e_l=1$;" should read --$e_i=1$;--; and
Line 67, "$r_{j,i+}2=e_{1+1}{\cdot}g_j+c_{i-n+1}{\cdot}w_j+(e_i{\cdot}g_{j-1}+c_{i-n}w_{j-1}+r_{j-2,i})$" should read
--$r_{j,i+2}=e_{i+1}{\cdot}g_j+c_{i-n+1}{\cdot}w_j+(e_i{\cdot}g_{j-1}+c_{i-n}{\cdot}w_{j-1}+r_{j-2,i})$--.

UNITED STATES PATENT AND TRADEMARK OFFICE
CERTIFICATE OF CORRECTION

PATENT NO. : 7,103,827 B2
APPLICATION NO. : 10/233504
DATED : September 5, 2006
INVENTOR(S) : Keiichi Iwamura It is certified that error appears in the above-identified patent and that said Letters Patent is hereby corrected as shown below:

COLUMN 13:

Line 51, "$C_{l-n+1}$," should read --$C_{i-n+1}$,--; and
Line 60, "$C_{l-n}$," should read --$C_{i-n}$,--.

COLUMN 14:

Line 12, "$C_{l+1}$" should read --$C_{i+1}$--;
Line 19, "$C_{l+1}$," should read --$C_{i+1}$,--; and
Line 25, "$C_1$" should read --$C_i$,--.

COLUMN 15:

Line 10, "$r_{j,1}$" should read --$r_{j,i}$--;
Line 12, "$r_{j,1}$'" should read --$r_{j,i}$'--;
Line 20, "$e_{i+1}=c_{i+1}+r_{m-1,i+1}$" should read --$e_{i+1}=c_{i+1}+r_{m-1,i+1}$--;
Line 65, "$e_{i+d-1}=c_{i+d-1}+r_{m-l,l+d-1}$" should read --$e_{i+d-1}=c_{i+d-1}+r_{m-l,i+d-1}$--; and
Line 67, "$r_{j,i+d}=e_{i+d-1} \cdot g_j+r_{j-1,i+d-1}$" (duplicate) should be deleted.

COLUMN 16:

Line 10, "$r_{j-d,1}$" should read --$r_{j-d,i}$--;
Line 11, "$C_{1+d-1}$." should read --$C_{i+d-1}$.--;
Line 43, "$C_{l+1}$" should read --$C_{i+1}$--; and
Line 57, "$C_{l+1}$," should read --$C_{i+1}$,--.

COLUMN 17:

Line 2, "$C_{1-n}$" should read --$C_{i-n}$--.

COLUMN 20:

Line 60, "the detection" should read --said detecting--; and
Line 64, "generation" should read --generating--.

UNITED STATES PATENT AND TRADEMARK OFFICE
CERTIFICATE OF CORRECTION

PATENT NO. : 7,103,827 B2
APPLICATION NO. : 10/233504
DATED : September 5, 2006
INVENTOR(S) : Keiichi Iwamura It is certified that error appears in the above-identified patent and that said Letters Patent is hereby corrected as shown below:

COLUMN 21:

Line 1, "a" should read --the--;
Line 3, "based" should be deleted;
Line 18, "$E(x)=x^{m-}1$." should read --$E(x)=x^{m-1}$.--;
Line 46, "the" should read --said--;
Line 50, "generation" should read --generating--; and
Line 65, "based" should be deleted.

COLUMN 22:

Line 33, "$E(x)=x^{m-}1$." should read --$E(x)=x^{m-1}$.--;
Line 42, "bit" should read --bits--; and
Line 66, "shortened" should be deleted.

COLUMN 23:

Line 13, "sequence if the" should read --sequence--.

COLUMN 24:

Line 17, "C(i=1," should read --$C_i$(i=1,--;
Line 20, "(i+1)-th" should read --(i-1)-th;
Line 47, "C(i=1 ,2 , ...)" should read --$C_i$(i=1, 2, ...)--; and
Line 49, "(i+1)-th" should read --(i-1)-th--.

COLUMN 25:

Line 21, "decoding." should read --decoding--; and
Line 40, "polynomial" should read --polynomial;--.

UNITED STATES PATENT AND TRADEMARK OFFICE
CERTIFICATE OF CORRECTION

PATENT NO.       : 7,103,827 B2
APPLICATION NO.  : 10/233504
DATED            : September 5, 2006
INVENTOR(S)      : Keiichi Iwamura It is certified that error appears in the above-identified patent and that said Letters Patent is hereby corrected as shown below:

COLUMN 26:

Line 17, "$C_i$" should read --$C_i$ as--; and
Line 30, "$^x a$" should read --$x^a$--.

Signed and Sealed this

Eighteenth Day of March, 2008

JON W. DUDAS
*Director of the United States Patent and Trademark Office*